(12) United States Patent
Lum et al.

(10) Patent No.: US 11,982,905 B2
(45) Date of Patent: May 14, 2024

(54) ELECTRONIC DEVICE DISPLAY WITH A BACKLIGHT HAVING LIGHT-EMITTING DIODES AND DRIVER INTEGRATED CIRCUITS IN AN ACTIVE AREA

(71) Applicant: Apple Inc., Cupertino, CA (US)

(72) Inventors: David W. Lum, Cupertino, CA (US); Kyung Wook Kim, Saratoga, CA (US); Kwang Soon Park, San Ramon, CA (US); Mingxia Gu, Campbell, CA (US); Jun Qi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 55 days.

(21) Appl. No.: 17/203,336

(22) Filed: Mar. 16, 2021

(65) Prior Publication Data

US 2021/0364854 A1 Nov. 25, 2021

Related U.S. Application Data

(60) Provisional application No. 63/029,069, filed on May 22, 2020, provisional application No. 63/029,048, (Continued)

(51) Int. Cl.
*G02F 1/1335* (2006.01)
*G02F 1/13357* (2006.01)
(Continued)

(52) U.S. Cl.
CPC .. *G02F 1/133612* (2021.01); *G02F 1/133601* (2021.01); *G02F 1/133603* (2013.01);
(Continued)

(58) Field of Classification Search
None
See application file for complete search history.

(56) References Cited

U.S. PATENT DOCUMENTS

| 7,413,330 B2 | 8/2008 | Furukawa |
| 7,658,529 B2 | 2/2010 | Aoki et al. |

(Continued)

FOREIGN PATENT DOCUMENTS

| CN | 101303480 A | 11/2008 |
| CN | 108803149 A | 11/2018 |

(Continued)

*Primary Examiner* — Crystal L Hammond
(74) *Attorney, Agent, or Firm* — Treyz Law Group, P.C.; Joseph F. Guihan

(57) ABSTRACT

A pixel array may be illuminated with backlight illumination from a backlight. The backlight may include a two-dimensional array of light-emitting diodes, with each light-emitting diode being placed in a respective cell. Different light-emitting diodes may have unique brightness magnitudes based on the content of the given display frame. Driver integrated circuits may control one or more associated light-emitting diodes to have a desired brightness level. The driver integrated circuits may be formed in an active area of the backlight. The driver integrated circuits may be arranged in groups that are daisy chained together. A digital signal (that includes information such as addressing information) may be propagated through the group of driver integrated circuits. To manage thermal performance of the backlight, the backlight may include a thermally conductive layer and/or a heat sink structure. To increase the efficiency of the backlight, the backlight may include one or more reflective layers.

20 Claims, 19 Drawing Sheets

Related U.S. Application Data filed on May 22, 2020, provisional application No. 63/029,082, filed on May 22, 2020.

(51) Int. Cl.
| | | |
|---|---|---|
| G09G 3/34 | (2006.01) | |
| H01L 25/16 | (2023.01) | |
| H05B 47/105 | (2020.01) | |
| H05B 47/16 | (2020.01) | |

(52) U.S. Cl.
CPC .. *G02F 1/133605* (2013.01); *G02F 1/133606* (2013.01); *G02F 1/133628* (2021.01); *G09G 3/3426* (2013.01); *H01L 25/167* (2013.01); *H05B 47/105* (2020.01); *H05B 47/16* (2020.01); *G09G 2320/0626* (2013.01)

(56) References Cited

U.S. PATENT DOCUMENTS

| | | | |
|---|---|---|---|
| 7,731,377 B2 | 6/2010 | Moriya et al. | |
| 7,755,715 B2 | 7/2010 | Kimura et al. | |
| 8,605,017 B2 | 12/2013 | Brown Elliott et al. | |
| 8,830,278 B2 | 9/2014 | Koyama et al. | |
| 9,153,732 B2 | 10/2015 | Oraw | |
| 9,157,579 B2 | 10/2015 | Liu et al. | |
| 9,286,838 B2 | 3/2016 | Yoshida | |
| 9,295,112 B2 | 3/2016 | Knapp | |
| 10,199,362 B1 | 2/2019 | Wu et al. | |
| 10,395,590 B1 | 8/2019 | Lin et al. | |
| 10,571,744 B1 | 2/2020 | Chang et al. | |
| 2008/0284944 A1 | 11/2008 | Jeong | |
| 2009/0309858 A1 | 12/2009 | Jin et al. | |
| 2009/0310335 A1* | 12/2009 | Park | H05K 1/11 362/234 |
| 2011/0050111 A1* | 3/2011 | Tanaka | G09G 3/3406 315/294 |
| 2013/0069560 A1* | 3/2013 | Kurita | H05B 47/10 315/294 |
| 2013/0293596 A1 | 11/2013 | Atkins | |
| 2014/0152632 A1 | 6/2014 | Shedletsky et al. | |
| 2014/0168037 A1 | 6/2014 | Sakariya et al. | |
| 2015/0198834 A1 | 7/2015 | Wu et al. | |
| 2015/0362791 A1* | 12/2015 | Kakuda | G02F 1/133385 349/61 |
| 2016/0077276 A1 | 3/2016 | Zhu et al. | |
| 2016/0218258 A1 | 7/2016 | Yamazaki et al. | |
| 2016/0306090 A1 | 10/2016 | Pu et al. | |
| 2018/0090103 A1* | 3/2018 | Zhang | G01K 13/00 |
| 2018/0231838 A1 | 8/2018 | Kumamoto et al. | |
| 2018/0233094 A1* | 8/2018 | Kumamoto | G09G 3/20 |
| 2018/0240420 A1* | 8/2018 | Kumamoto | G09F 9/00 |
| 2018/0247588 A1 | 8/2018 | Lee et al. | |
| 2018/0307100 A1 | 10/2018 | Xu et al. | |
| 2018/0356684 A1 | 12/2018 | Chang et al. | |
| 2019/0265548 A1 | 8/2019 | Liu et al. | |
| 2019/0285950 A1 | 9/2019 | Liu et al. | |
| 2020/0096820 A1 | 3/2020 | Yasunaga et al. | |
| 2020/0279975 A1 | 9/2020 | Jung et al. | |
| 2021/0165276 A1 | 6/2021 | Garbar et al. | |

FOREIGN PATENT DOCUMENTS

| | | |
|---|---|---|
| JP | 2007294385 A | 11/2007 |
| JP | 2009158125 A | 7/2009 |
| JP | 2013182076 A | 9/2013 |
| JP | 2019102297 A | 6/2019 |
| KR | 20070083342 A | 8/2007 |
| KR | 20120130583 A | 12/2012 |
| KR | 101258083 B1 | 4/2013 |
| KR | 101482077 B1 | 1/2015 |
| WO | 2011024496 A | 3/2011 |
| WO | 2017038080 A1 | 3/2017 |

\* cited by examiner

ELECTRONIC DEVICE DISPLAY WITH A BACKLIGHT HAVING LIGHT-EMITTING DIODES AND DRIVER INTEGRATED CIRCUITS IN AN ACTIVE AREA

This application claims the benefit of U.S. provisional patent application Ser. No. 63/029,048, filed May 22, 2020, U.S. provisional patent application Ser. No. 63/029,069, filed May 22, 2020, and U.S. provisional patent application Ser. No. 63/029,082, filed May 22, 2020, which are hereby incorporated by reference herein in their entireties.

BACKGROUND

This relates generally to electronic devices with displays, and, more particularly, to displays with backlights.

Electronic devices such as computers and cellular telephones have displays. Some displays such organic light-emitting diode displays have arrays of pixels that generate light. In displays of this type, backlighting is not necessary because the pixels themselves produce light. Other displays contain passive pixels that can alter the amount of light that is transmitted through the display to display information for a user. Passive pixels do not produce light themselves, so it is often desirable to provide backlight for a display with passive pixels. Passive pixels may be formed from a layer of liquid crystal material formed between two electrode layers and two polarizer layers.

In a typical backlight assembly for a display, an edge-lit light guide plate is used to distribute backlight generated by a light source such as a light-emitting diode light source. A reflector may be formed under the light guide plate to improve backlight efficiency.

Conventional backlight assemblies may cause visible artifacts, may not be robust, and may occupy an undesirably large amount of space within an electronic device.

It would therefore be desirable to be able to provide displays with improved backlights.

SUMMARY

A display may have an array of pixels for displaying images for a viewer. The array of pixels may be liquid crystal pixels formed from display layers such as a color filter layer, a liquid crystal layer, a thin-film transistor layer, an upper polarizer layer, and a lower polarizer layer.

The pixel array may be illuminated with backlight illumination from a backlight unit. The backlight unit may include an array of light-emitting diodes, with each light-emitting diode being placed in a respective cell. The brightness of each light-emitting diode may be changed in each display frame to optimize the viewing of the display. Different light-emitting diodes may have unique brightness magnitudes based on the content of the given display frame.

Driver integrated circuits may be used to control the light-emitting diodes of the backlight. Each driver integrated circuit may control one or more associated light-emitting diodes to have a desired brightness level. The driver integrated circuits may be formed in an active area of the backlight. For example, the light-emitting diodes may be mounted to the upper surface of a glass substrate. The driver integrated circuits may also be mounted to the upper surface of the glass substrate. The driver integrated circuits may be interspersed amongst the light-emitting diodes.

The driver integrated circuits may be arranged in groups that are daisy chained together. A digital signal (that includes information such as addressing information) may be propagated through the group of driver integrated circuits. Each driver integrated circuit may have a small number of input-output contacts (pins) for minimal complexity. The driver integrated circuits may have four pins, six pins, or nine pins, as examples.

To manage thermal performance of the backlight, the backlight may include a thermally conductive layer that is attached to a lower surface of the glass substrate for the light-emitting diodes. The glass substrate may also have exposed conductive layers that are coupled to heat sinks for additional heat dispersion. Sensors such as temperature sensors and/or optical sensors may be formed on the upper surface of the glass substrate. The sensors may provide real-time measurements to a controller such as a timing controller. The timing controller may, in turn, control operation of the light-emitting diodes in the backlight based at least partially on the sensor information.

To increase the efficiency of the backlight, the glass substrate may be formed from white diffusive glass. Additionally, a reflective layer may be formed on the upper surface of the glass substrate. A reflective layer may also be formed on a lower surface of the glass substrate. Reflective layers may be formed on the top surfaces of the driver integrated circuits to prevent a shadow from appearing in the active area of the display where the driver integrated circuits are present. The light-emitting diodes may be arranged in a non-square-grid layout to reduce periodicity and prevent mura.

DETAILED DESCRIPTION

Figure 1:
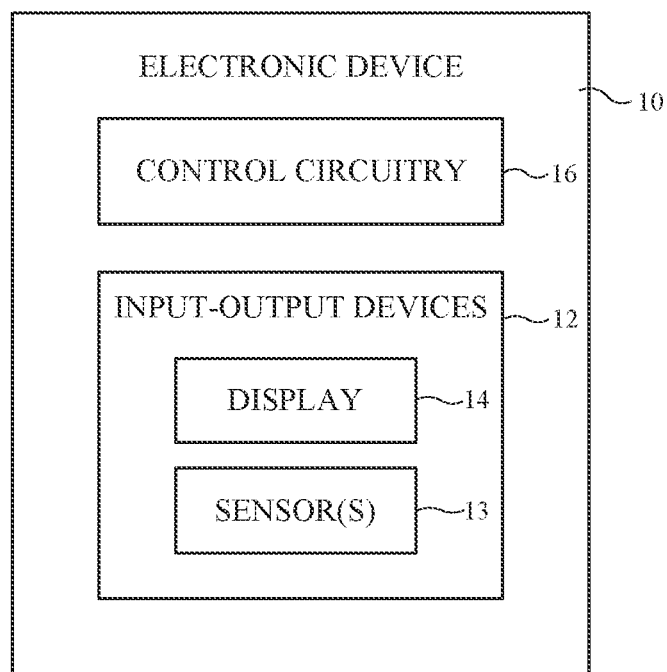
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be a liquid crystal display or may be a display based on other types of display technology (e.g., organic light-emitting diode displays). Device configurations in which display 14 is a liquid crystal display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
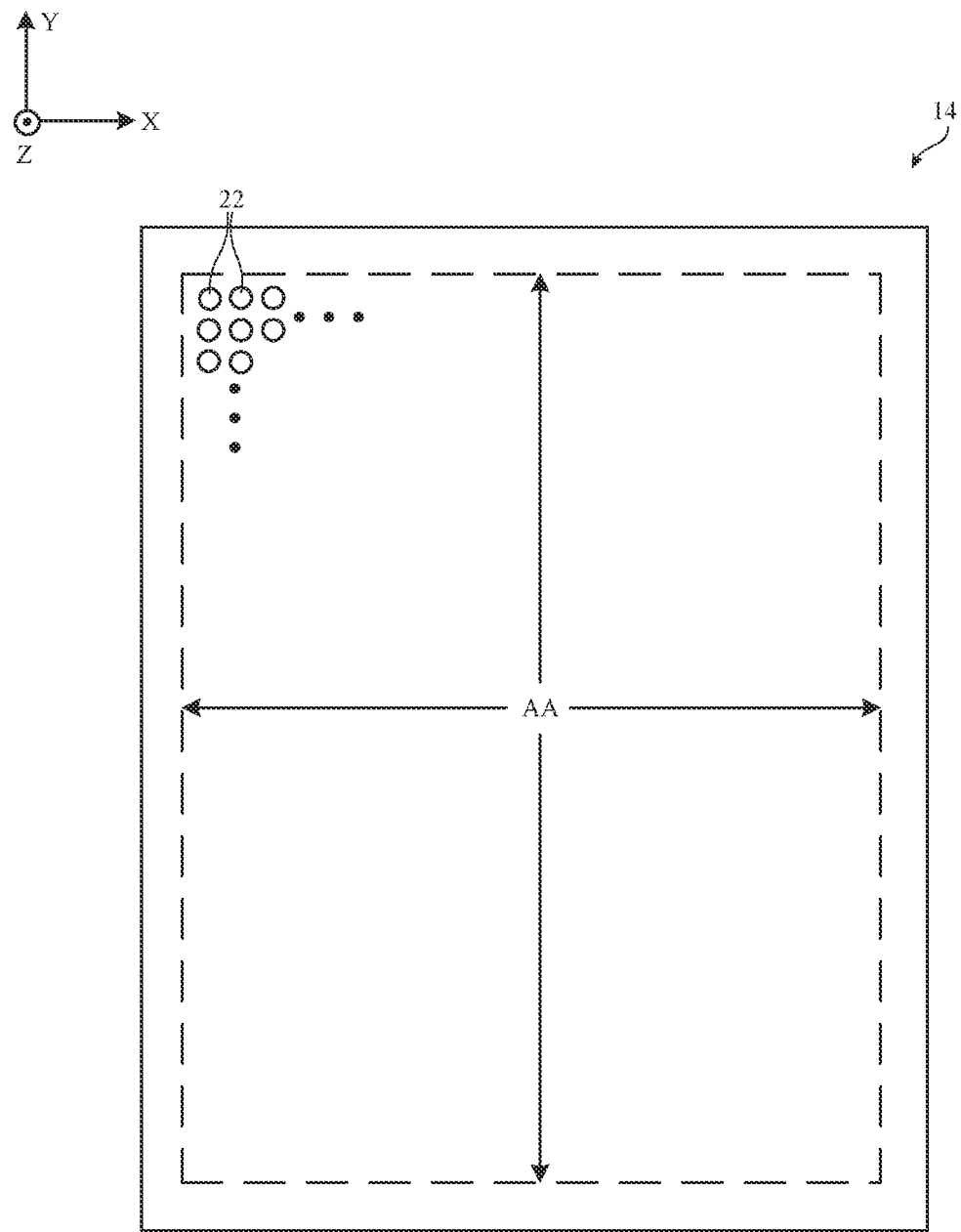
FIG. 2 is a top view of an illustrative display in accordance with an embodiment.

FIG. 2 is a top view of a portion of display 14 showing how display 14 may have an array of pixels 22. Pixels 22 may have color filter elements of different colors such as red color filter elements R, green color filter elements G, and blue color filter elements B. Pixels 22 may be arranged in rows and columns and may form active area AA of display 14. Pixels 22 may be formed form liquid crystal display layers, as one example. The rectangular shape of display 14 and active area AA in FIG. 2 is merely illustrative. If desired, the active area AA may have a non-rectangular shape (e.g., a shape with one or more curved portions). For example, the active area may have rounded corners in one example.

Figure 3:
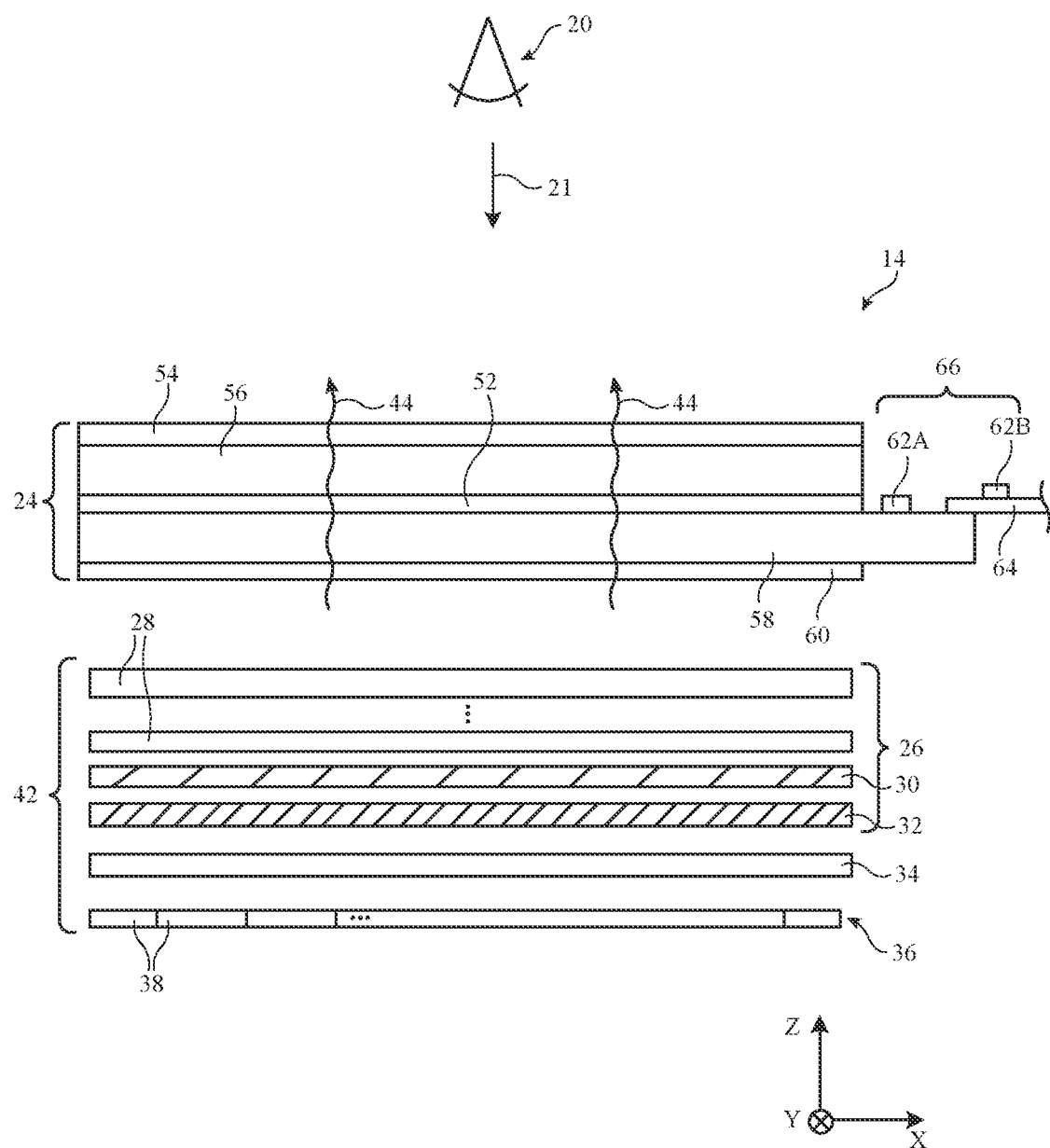
FIG. 3 is a cross-sectional side view of an illustrative display in an electronic device that has a backlight and a pixel array in accordance with an embodiment.

A cross-sectional side view of display 14 is shown in FIG. 3. As shown in FIG. 3, display 14 may include a pixel array such as pixel array 24. Pixel array 24 may include an array of pixels such as pixels 22 of FIG. 2 (e.g., an array of pixels having rows and columns of pixels). Pixel array 24 may be formed from a liquid crystal display module (sometimes referred to as a liquid crystal display or liquid crystal layers) or other suitable pixel array structures.

During operation of display 14, images may be displayed on pixel array 24. Backlight unit 42 (which may sometimes be referred to as a backlight, backlight layers, backlight structures, a backlight module, a backlight system, etc.) may be used in producing backlight illumination 44 that passes through pixel array 24. This illuminates any images on pixel array 24 for viewing by a viewer such as viewer 20 who is viewing display 14 in direction 21.

Backlight unit 42 may have optical films 26, a light diffuser such as light diffuser (light diffuser layer) 34, and light-emitting diode (LED) array 36. Light-emitting diode array 36 may contain a two-dimensional array of light sources such as light-emitting diodes 38 that produce backlight illumination 44. Light-emitting diodes 38 may, as an example, be arranged in rows and columns and may lie in the X-Y plane of FIG. 3.

The light produced by each light-emitting diode 38 may travel upwardly along dimension Z through light diffuser 34 and optical films 26 before passing through pixel array 24. Light diffuser 34 may contain light-scattering structures that diffuse the light from light-emitting diode array 36 and thereby help provide uniform backlight illumination 44. Optical films 26 may include films such as dichroic filter 32, phosphor layer 30, and films 28. Films 28 may include brightness enhancement films that help to collimate light 44 and thereby enhance the brightness of display 14 for user 20 and/or other optical films (e.g., compensation films, etc.).

Light-emitting diodes 38 may emit light of any suitable color. With one illustrative configuration, light-emitting diodes 38 emit blue light. Dichroic filter layer 32 may be configured to pass blue light from light-emitting diodes 38 while reflecting light at other colors. Blue light from light-emitting diodes 38 may be converted into white light by a photoluminescent material such as phosphor layer 30 (e.g., a layer of white phosphor material or other photoluminescent material that converts blue light into white light). If desired, other photoluminescent materials may be used to convert blue light to light of different colors (e.g., red light, green light, white light, etc.). For example, one layer 30 (which may sometimes be referred to as a photoluminescent layer or color conversion layer) may include quantum dots that convert blue light into red and green light (e.g., to produce white backlight illumination that includes, red, green, and blue components, etc.). Configurations in which light-emitting diodes 38 emit white light (e.g., so that layer 30 may be omitted, if desired) may also be used.

In configurations in which layer 30 emits white light such as white light produced by phosphorescent material in layer 30, white light that is emitted from layer 30 in the downwards (−Z) direction may be reflected back up through pixel array 24 as backlight illumination by dichroic filter layer 32 (i.e., layer 32 may help reflect backlight outwardly away from array 36). In configurations in which layer 30 includes, for example, red and green quantum dots, dichroic filter 32 may be configured to reflect red and green light from the red and green quantum dots, respectively to help reflect backlight outwardly away from array 36. By placing the photoluminescent material of backlight 42 (e.g., the material of layer 30) above diffuser layer 34, light-emitting diodes 38 may be configured to emit more light towards the edges of the light-emitting diode cells (tiles) of array 36 than at the centers of these cells, thereby helping enhance backlight illumination uniformity.

In a configuration in which pixel array 24 is formed using a liquid crystal display, pixel array 24 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54. Liquid crystal display structures of other types may be used in forming pixel array 24, if desired.

Layers 56 and 58 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of pixel circuits based on thin-film transistors and associated electrodes (pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer. Configurations in which color filter elements are combined with thin-film transistor structures on a common substrate layer may also be used.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example). Integrated circuits such as integrated circuit 62A and/or flexible printed circuits such as flexible printed circuit 64 may be attached to substrate 58 in ledge region 66 (as an example).

Figure 4:
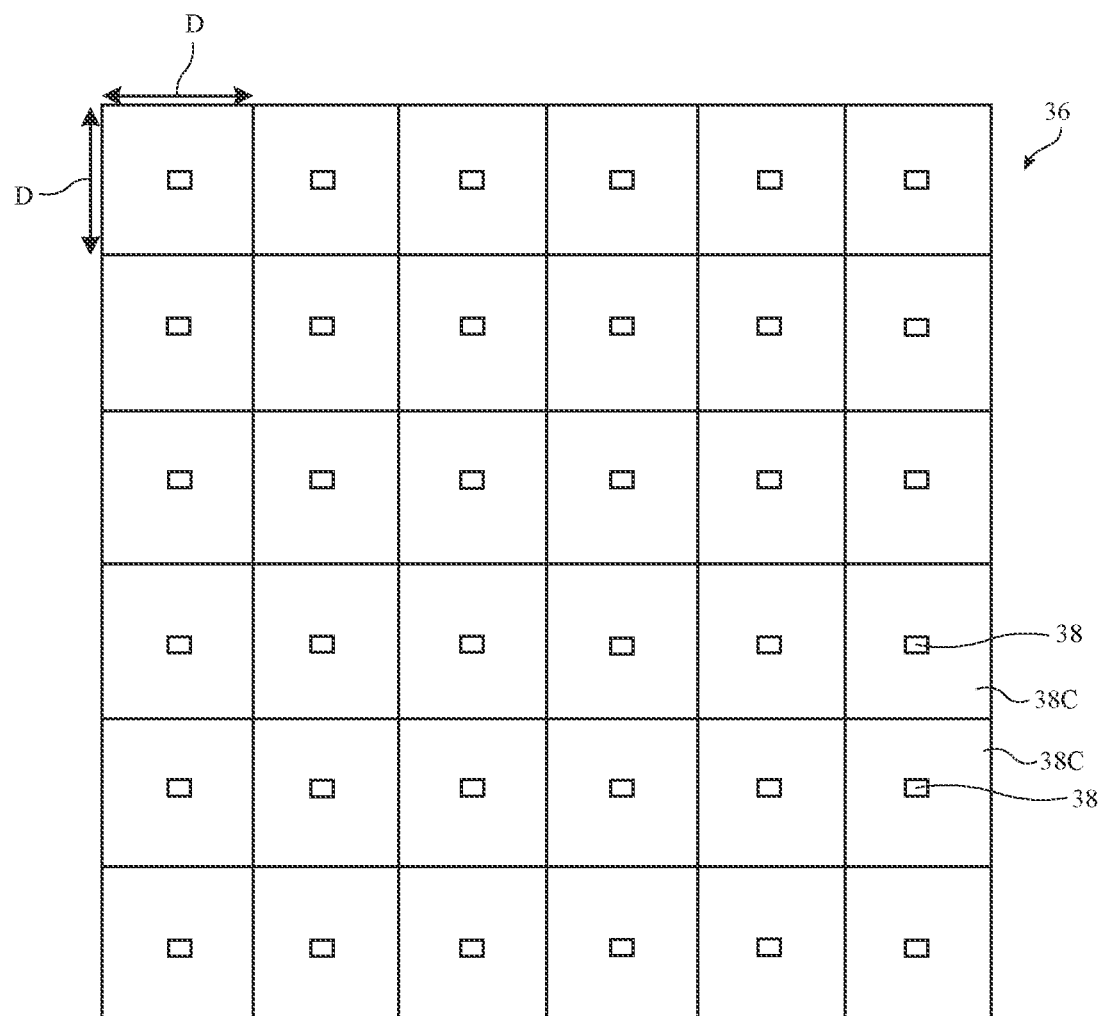
FIG. 4 is a top view of an illustrative backlight having light-emitting diodes arranged in respective cells in accordance with an embodiment.

FIG. 4 is a top view of an illustrative light-emitting diode array for backlight 42. As shown in FIG. 4, light-emitting diode array 36 may contain rows and columns of light-emitting diodes 38. Each light-emitting diode 38 may be associated with a respective cell (tile area) 38C. The length D of the edges of cells 38C may be 2 mm, 18 mm, 1-10 mm, 1-4 mm, 10-30 mm, more than 5 mm, more than 10 mm, more than 15 mm, more than 20 mm, less than 25 mm, less than 20 mm, less than 15 mm, less than 10 mm, or other suitable size. If desired, hexagonally tiled arrays and arrays with light-emitting diodes 38 that are organized in other suitable array patterns may be used. In arrays with rectangular cells, each cell may have sides of equal length (e.g., each cell may have a square outline in which four equal-length cell edges surround a respective light-emitting diode) or each cells may have sides of different lengths (e.g., a non-square rectangular shape). The configuration of FIG. 4 in which light-emitting diode array 36 has rows and columns of square light-emitting diode regions such as cells 38C (e.g., a two-dimensional array of cells 38C) is merely illustrative.

In some cases, each cell 38C may include a single light-emitting diode. Alternatively, each cell 38C may have a light source that is formed form an array of light-emitting diode dies (e.g., multiple individual light-emitting diodes 38 arranged in an array such as a 2×2 group of light-emitting diodes or 3×3 group of light-emitting diodes in each cell 38C). The diodes 38 in light source 38' may be mounted on a common substrate, may be mounted on a printed circuit board substrate that extends across array 36, may be mounted on a glass substrate that extends across array 36, or may be mounted in array 36 using other desired arrangements. In general, each cell 38C may include a single light-emitting diode, a pair of light-emitting diodes, 2-20 light-emitting diodes, at least 2 light-emitting diodes, at least 4 light-emitting diodes, at least 8 light-emitting diodes, fewer than 5 light-emitting diodes, between 4 and 12 light-emitting diodes, between 8 and 12 light-emitting diodes, between 8 and 10 light-emitting diodes, 9 light-emitting diodes, or other desired number of light-emitting diodes.

Light-emitting diodes 38 may be controlled in unison by control circuitry in device 10 or may be individually controlled. Controlling the light-emitting diodes individually may enable the electronic device to implement a local dimming scheme that helps improve the dynamic range of images displayed on pixel array 24 and that potentially reduces the power consumption of the backlight. The dynamic range of a display may be considered the ratio between the light of the highest intensity (e.g., the brightest light) that the display is capable of emitting and the light of the lowest intensity (e.g., the dimmest light) that the display is capable of emitting.

Figure 5:
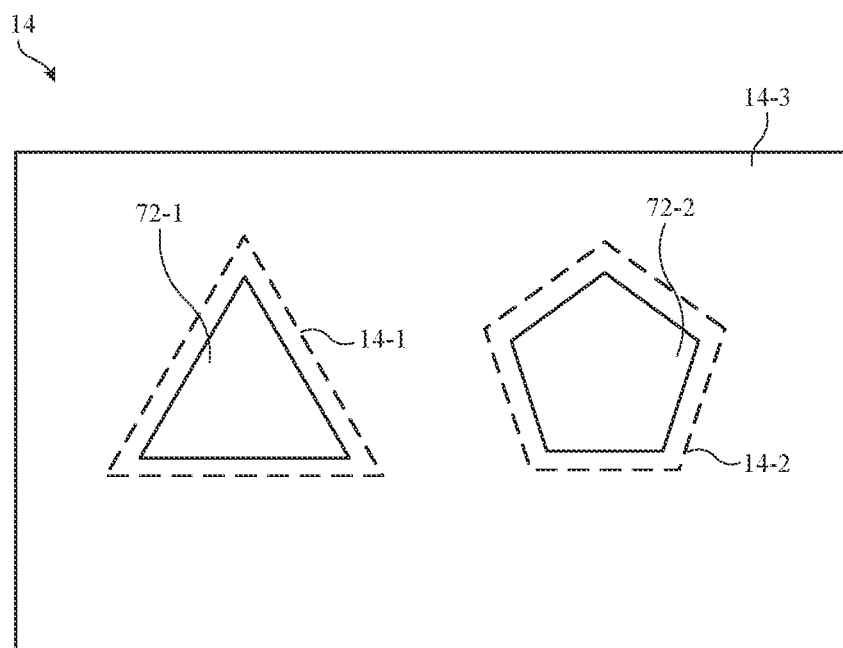
FIG. 5 is a top view of an illustrative display showing how different portions of the display may have different target brightness levels in accordance with an embodiment.

If all of the light-emitting diodes in backlight unit 42 are controlled in unison, the dynamic range of the display may be limited. Consider the example depicted in FIG. 5. In FIG. 5, objects such as objects 72-1 and 72-2 are displayed on display 14 (sometimes referred to as screen 14). In this example, object 72-1 may have a high brightness level. Object 72-2 may have an intermediate brightness level. The background of the display may have a low brightness level. If the light-emitting diodes providing backlight for display 14 in FIG. 5 are controlled in unison, all of the light-emitting diodes may be set to a brightness that is optimized for object 72-1. In this scenario, object 72-1 may be displayed with its intended brightness. However, the background of the display is also receiving backlight with a high brightness optimized for object 72-1. Therefore, the background of the display may appear brighter than desired due to display limitations such as light leakage through the pixels or other limitations, and the dynamic range of the display is lower than desired. Alternatively, all of the light-emitting diodes may be set to a brightness that is optimized for the background of the display. In this scenario, the background may be displayed with its intended brightness. However, object 72-1 is also receiving backlight with a low brightness optimized for the background. Therefore, object 72-1 will appear dimmer than desired and the dynamic range of the display will be lower than desired. In yet another embodiment, the brightness of all of the light-emitting diodes may be set to a brightness that is optimized for object 72-2. In this scenario, object 72-1 will appear dimmer than desired and the background will appear brighter than desired.

Additionally, controlling all of the light-emitting diodes in backlight unit 42 in unison may introduce power consumption limitations. The maximum allowable power consumption of the backlight unit may prevent all of the light-emitting diodes from being operated at a peak brightness level. For example, all of the light-emitting diodes may not be able to emit light with a desired brightness for bright object 72-1 while meeting power consumption requirements.

To summarize, operating all of the light-emitting diodes in the backlight in unison such that the backlight brightness is the same across the display forces trade-offs in the aesthetics of the displayed image. Portions of the display may be dimmer than desired or brighter than desired and the dynamic range of the display will be lower than desired.

To increase the dynamic range of the display (and to allow for peak brightness levels without exceeding power consumption requirements), the light-emitting diodes in backlight unit 42 may be controlled individually. For example, light emitting diodes in region 14-1 of the display may have a high brightness optimized for the high brightness of object 72-1, light-emitting diodes in region 14-2 of the display may have a brightness optimized for the intermediate brightness of object 72-2, and light-emitting diodes in region 14-3 of the display may have a low brightness optimized for the low brightness of the background of the display. In one example, the light-emitting diodes in region 14-1 may operate at a maximum brightness whereas the light-emitting diodes in background region 14-3 may be turned off (e.g., operate at a minimum brightness). Varying the brightness of the light-emitting diodes across the display in this manner increases the dynamic range of the display.

Having a two-dimensional array of independently controllable light sources such as light-emitting diodes 38 for producing backlight illumination 44 therefore may increase the dynamic range of the display. Backlights with two-dimensional arrays of light-emitting diodes may sometimes be referred to as two-dimensional backlights. These types of backlights may also sometimes be referred to as direct-lit backlights. The direct-lit backlights emit light vertically towards the pixel array, as opposed to backlights with edge-lit light guide plates (where light is emitted parallel to the plane of the pixel array and redirected vertically towards the pixel array by the light guide plate).

Driving circuitry may be included in display 14 to controlling the light-emitting diodes in backlight 42. Driving circuitry for the LEDs may be formed from integrated circuits, thin-film transistor circuits, and/or other suitable circuitry. In one example, driving circuitry may be incorporated as thin-film transistor circuitry on a rigid printed circuit board (e.g., a printed circuit board with a plurality of layers of dielectric material such as polyimide and conductive layers). However, the costs associated with such an arrangement may be high, particularly in backlights with a high number of light-emitting diodes. An alternative arrangement for the LED driving circuitry is for driver integrated circuits (sometimes referred to as driver ICs) to be included in backlight 42. Each driver IC may control one or more corresponding light-emitting diodes. In this way, the light emitting diodes may be controlled to have varying brightness magnitudes across the backlight. The driver integrated circuits may also be used in combination with a glass substrate in one example. In other words, instead of the light-emitting diodes and driver ICs being mounted on a rigid printed circuit board (e.g., formed using polyimide), the light-emitting diodes and driver ICs may be mounted on a glass substrate. The glass substrate may have conductive traces (e.g., copper traces) to allow signals to be transferred between components as necessary.

Figure 6:
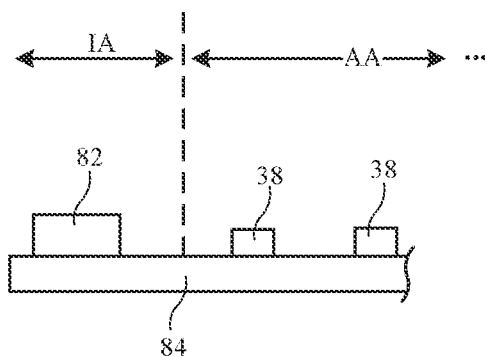
FIG. 6 is a cross-sectional side view of an illustrative backlight having light-emitting diodes (LEDs) on an upper surface of a substrate and LED driver integrated circuits (ICs) on the upper surface of the substrate in an inactive area of the display in accordance with an embodiment.

There are numerous options for how to mount the LEDs and corresponding driver ICs on a substrate. As shown in FIG. 6, LEDs 38 are mounted on an upper surface of substrate 84. In the arrangement of FIG. 6, the driver ICs 82 are also mounted on the upper surface of substrate 84 in the inactive area IA. The area of the backlight with LEDs 38 corresponds to the active area AA of the display (e.g., the area of the display that emits light). The backlight 42 may be described as having an active area and inactive area, similar to the pixel array. The active area of the backlight and the active area of the pixel array may have the same footprint. The inactive area of the backlight and the inactive area of the pixel array may have the same footprint or may optionally have different footprints. The active and inactive areas of either the backlight or pixel array may sometimes simply be referred to as simply the active and inactive areas of the display.

As shown in FIG. 6, driver IC 82 is positioned at the periphery of the substrate in an inactive area (IA) of the display. The driver ICs may all be positioned at the periphery of substrate 84 and may each control a corresponding group of light-emitting diodes. This type of arrangement has numerous limitations, however. First, it is, in general, desirable to minimize the size of the inactive area. The inactive area takes up valuable space within the electronic device without contributing to the aesthetics of the display. Having the driver ICs in the periphery of the display undesirably increases the footprint of the display without increasing the light-emitting area of the display. Additionally, positioning driver ICs only in the inactive area of the display may make it challenging to increase the number of LEDs within the backlight. By only having the driver ICs at the periphery of the backlight, each driver IC may have to control a large number of light-emitting diodes (because the peripheral driver ICs have to control both the central LEDs and peripheral LEDs).

Figure 7:
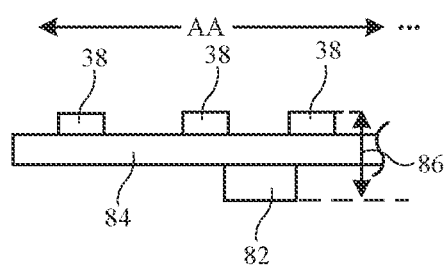
FIG. 7 is a cross-sectional side view of an illustrative backlight having light-emitting diodes (LEDs) on an upper surface of a substrate and LED driver integrated circuits (ICs) on a lower surface of the substrate in an active area of the display in accordance with an embodiment.

An alternate arrangement for the backlight is shown in FIG. 7. As shown, in this arrangement the light-emitting diodes 38 are positioned on an upper surface of substrate 84 whereas the driver IC 82 is positioned on a lower surface of substrate 84. Having the driver IC positioned on the lower surface in this manner eliminates the need for the large inactive area of FIG. 6. In other words, the active area may extend virtually to the edge of substrate 84. However, positioning the driver ICs on the lower surface of the substrate increases the total thickness 86 of the backlight unit. Additionally, more complex conductive routing (e.g., with conductive vias) may be required for driver IC 82 to properly control the light-emitting diodes on the opposing side of substrate 84.

Figure 8:
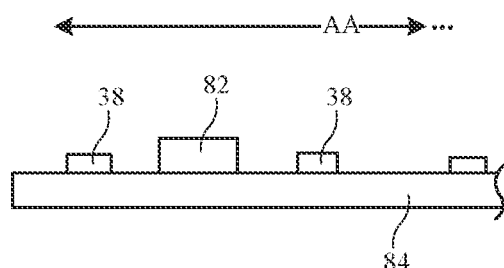
FIG. 8 is a cross-sectional side view of an illustrative backlight having light-emitting diodes (LEDs) on an upper surface of a substrate and LED driver integrated circuits (ICs) on the upper surface of the substrate in an active area of the display in accordance with an embodiment.

FIG. 8 is a cross-sectional side view of another possible arrangement where the driver ICs are positioned on the upper surface of substrate 84 within the active area. As shown, the driver ICs may be positioned between LEDs of the backlight. With this arrangement, the size of the inactive area may be minimized (because the driver ICs do not increase the size of the inactive area). Because the driver ICs are on the upper surface of substrate 84, the thickness and complexity of the backlight may be mitigated. Additionally, because the driver ICs are positioned within the active area, each LED may have a corresponding driver IC. The driver ICs may therefore have a low complexity and size (because each driver IC only needs to control a small number of LEDs). Using low complexity driver ICs reduces the number of interconnects required and allows for the size of the backlight to be scaled to larger sizes (i.e., larger numbers of LEDs within the backlight).

Digital signals may be used to control the driver ICs 82 (sometimes referred to as LED driver ICs 82 or backlight driver ICs 82). Using digital control lines for the backlight may enable larger backlights on a single substrate, may reduce the total pin count for each driver IC, may reduce the number of interconnects within the backlight, and may increase the magnitude of drive currents enabled by the driver ICs.

As previously discussed, substrate 84 may optionally be a rigid printed circuit board (e.g., with a plurality of insulating layers formed from a dielectric material such as polyimide). Alternatively, to reduce the manufacturing cost and complexity of the LED array, substrate 84 (sometimes referred to as LED substrate 84) may formed from glass.

Conductive traces (e.g., copper traces) may be deposited on the glass substrate to allow electrical connections between components mounted to the glass substrate.

Figure 9:
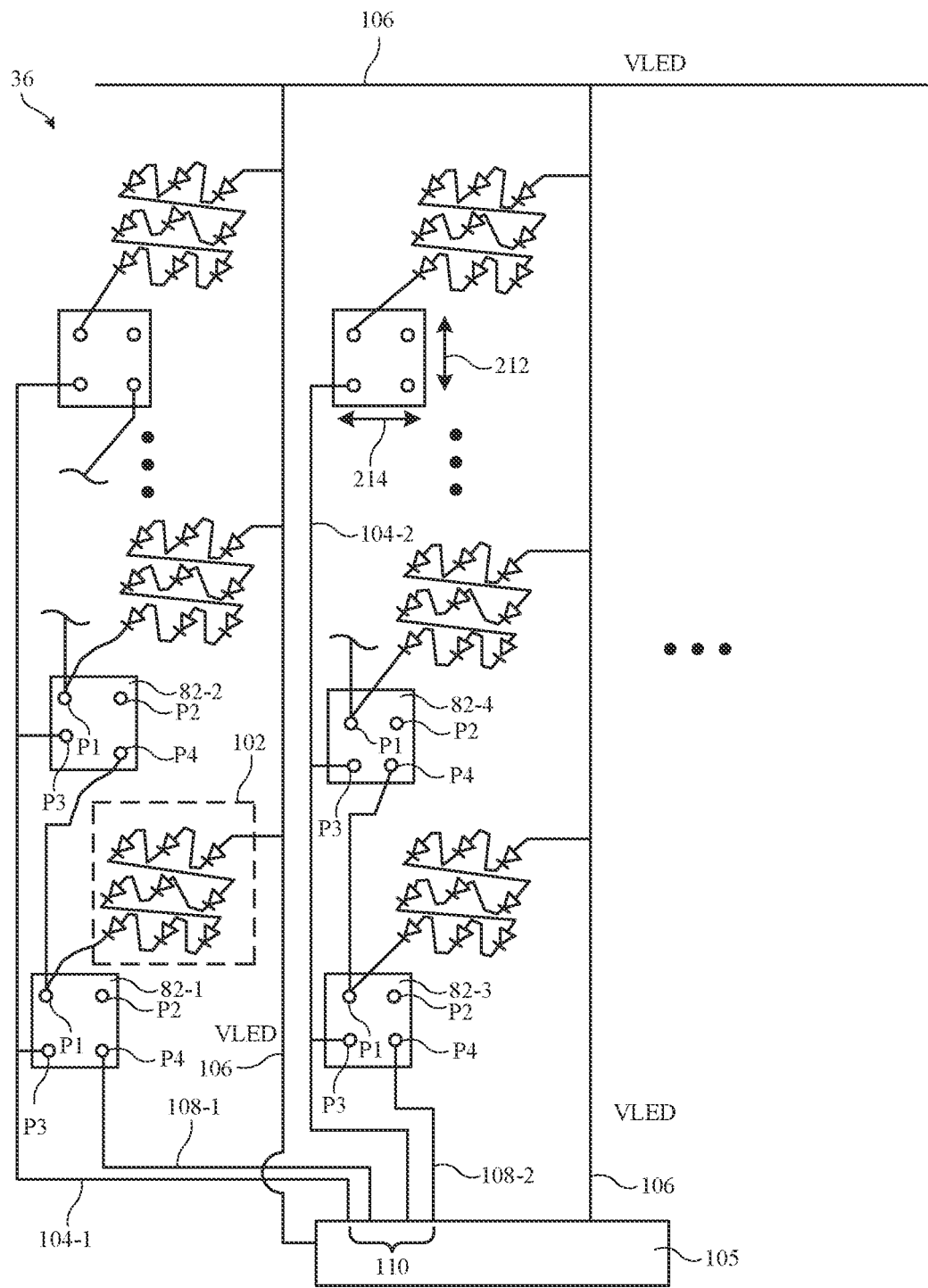
FIG. 9 is a top view of an illustrative LED array that includes driver ICs distributed throughout the active area of the display in accordance with an embodiment.

FIG. 9 is a top view of an illustrative light-emitting diode array having driver ICs distributed throughout the active area of the display. As shown in FIG. 9, each driver IC 82 may control a corresponding LED group 102. Each LED group 102 (sometimes referred to as LED zone 102) may include one or more light-emitting diodes. The light-emitting diodes may be connected in series between a power supply line 106 and the driver IC. In the example of FIG. 9, each LED zone 102 includes nine LEDs that are connected in series between power supply line 106 and the driver IC.

Herein, the term LED group (or LED zone) may be used to refer to an independently controllable group of LEDs. For example, first and second light-emitting diodes that are controlled separately would be referred to as first and second unique LED groups (even though there is only one LED per group). In contrast, nine light-emitting diodes that are controlled together is referred to as a single LED group. Each LED group has an associated LED cell, which may refer to the light-emitting area associated with that LED group. Because the LEDs emit light across a broad range of angles (as opposed to highly collimated light), the footprint of a light-emitting area associated with a given LED group will be larger than the footprint of the LED group itself. Because each LED group is controlled to have one brightness value, the LED cell associated with each group may have an associated single brightness value. In other words, the brightness may be, ideally, uniform across the LED cell. In practice, there may be some non-uniformities across the LED cell (e.g., caused by hotspots over the LEDs). Films 26 discussed in connection with FIG. 3 may be designed to increase uniformity of light within each LED cell.

Power supply line 106 may provide a power supply voltage VLED (e.g., a positive power supply voltage) across the LED array. Each LED group may have a light-emitting diode with a first terminal (e.g., the anode) coupled to the power supply line. The second terminal (e.g., the cathode) of that LED is then connected to the first terminal of the subsequent LED. This chain may continue, with each LED having a first terminal coupled to the second terminal of the preceding LED and a second terminal coupled to the first terminal of the subsequent LED. In the example of FIG. 9, each LED has an anode coupled to the cathode of the preceding LED and a cathode coupled to the anode of the subsequent LED. The first LED in the group has an anode coupled to the supply line 106. The last LED in the group has a cathode coupled to driver IC 82.

This arrangement may be reversed if desired, with the first LED in the group having a cathode coupled to the supply line (e.g., a ground power supply line), the last LED in the group having an anode coupled to the driver IC, and the other LEDs having a cathode coupled to the anode of the preceding LED and an anode coupled to the cathode of the subsequent LED.

As shown in FIG. 9, the driver ICs may optionally be arranged in an array of rows and columns. Each row and column of driver ICs may include any desired number of driver ICs. Each driver IC 82 has input-output contacts referred to as pins. The pins are used by the driver IC to transmit and receive signals.

In FIG. 9, each driver IC has four pins (P1, P2, P3, and P4). Various subsets of the driver ICs may be chained together in series (e.g., daisy-chained). In FIG. 9, each column of driver ICs are chained together. However, it should be noted that smaller larger groups of driver ICs may be chained together if desired.

Pin P4 may sometimes be referred to as an input pin and pin P1 may sometimes be referred to as an output pin. Pin P4 for one of the driver ICs in a given column (e.g., driver IC 82-1 in FIG. 9) may receive an input from control line 108-1. The input from pin P4 on driver IC 82-1 may subsequently be output at pin P1 on driver IC 82-1. The output from driver IC 82-1 is then received at input pin P4 of driver IC 82-2 (e.g., the next driver IC in the column).

In other words, the output of each driver IC is provided as the input to the next driver IC in the chain (e.g., in the column in FIG. 9). This means that output pin P1 of each driver IC is electrically connected to input pin P4 of an adjacent driver IC. Information provided via signal line 108-1 may therefore be propagated through the driver ICs in a given column. In one example, signal line 108-1 is a digital signal line that is configured to provide initialization information (e.g., address information) to the driver ICs. The initialization information is provided to driver IC 82-1 by signal line 108-1. Driver IC 82-1 then passes the initialization information to the next driver IC (82-2), which passes the initialization information to the next driver IC, etc.

Each column of driver ICs may have a corresponding digital signal line for providing initialization information to input pin P4 of at least one driver IC. As shown in FIG. 9, a second column of driver ICs may have a corresponding digital signal line 108-2 that provides information to pin P4 of driver IC 82-3. Driver IC 82-3 then passes the initialization information to the next driver IC (82-4), which passes the initialization information to the next driver IC, etc.

Each driver IC also includes a pin P3 that is coupled to a respective signal line. For example, pin P3 of driver ICs 82-1 and 82-2 are coupled to signal line 104-1. Pin P3 of driver ICs 82-3 and 82-4 are coupled to signal line 104-2. In other words, each column of driver ICs may have a corresponding signal line that is used to provide information to pin P3 of the driver ICs. In this example, signal line 104-1 may be used to provide LED brightness values to the driver ICs. For example, signal line 104-1 indicates to driver IC 82-1 to update the brightness of its corresponding LED group 102 to a first given magnitude, indicates to driver IC 82-2 to update the brightness of its corresponding LED group 102 to a second given magnitude, etc. Signal line 104-2 indicates to driver IC 82-3 to update the brightness of its corresponding LED group 102 to a third given magnitude, indicates to driver IC 82-4 to update the brightness of its corresponding LED group 102 to a fourth given magnitude, etc.

Signal lines 104 and 108 may be digital signal lines that are used to convey digital signals. The signal lines may be used to convey data, instructions, or any other desired information. The signal lines may therefore sometimes be referred to as control lines, data lines, etc. Multiple signal lines may be part of a single bus 110. FIG. 9 shows an example where signal lines 104-1, 104-2, 108-1, and 108-2 are part of bus 110.

The LED array may include a plurality of busses, each of which provides signals to a corresponding subset of driver IC columns. In other words, the LED array may have a given number of busses (x). Each of those busses may provide one or more signals to a given number of driver IC columns (y). Each driver IC column may have a given number of driver ICs (z). Any desired values may be used for x, y, and z. In one illustrative example, there may be 24 busses, 2 driver IC columns per bus, and 27 driver ICs per column. This example is merely illustrative. In general, the LED array may include any desired number of busses (e.g., 1, 2, more than 2, more than 5, more than 10, more than 20, more than 30, more than 50, more than 100, more than 500, less than 100, less than 40, less than 30, less than 20, between 20 and 30, between 20 and 25, between 15 and 50, etc.). The LED array may include any desired number of driver IC columns per bus (e.g., 1, 2, 3, 4, more than 4, more than 8, less than 10, less than 5, between 1 and 4, etc.). The LED array may include any desired number of driver ICs per driver IC column (e.g., more than 5, more than 10, more than 20, more than 30, more than 50, more than 100, more than 500, less than 100, less than 40, less than 30, less than 20, between 20 and 30, between 25 and 30, between 20 and 50, etc.). Busses may also provide signals for partial columns of driver ICs in an arrangement where only part of one or more columns are chained together.

Pin P2 in each driver IC may be coupled to ground (e.g., a ground power supply voltage). Therefore, each driver IC in FIG. 9 sinks current through its LED group 102 to ground. In the example of FIG. 9, each driver IC is coupled between the cathode of the last LED in the chain and ground. This example is merely illustrative. In an alternative arrangement, each driver IC could be coupled between the anode of the first LED in the chain and the positive power supply line 106.

The signal lines in FIG. 9 (e.g., 104-1, 104-2, 108-1, 108-2, and 106) may be coupled to a connection area 104 of the LED array. Connection area 105 may be, for example, a connector that is coupled to a controller that is off of the LED substrate. This example is merely illustrative. In general, any desired connection scheme may be used to provide desired signals on the signal lines.

Each driver IC may have a length 212 and a width 214. Reducing the complexity of the driver IC (e.g., by only having four pins, having each driver IC only control 1 LED group, etc.) may allow for the length and width of the driver IC to be reduced. The length and width of the driver IC may be any desired respective distances (e.g., less than 0.5 millimeters, less than 1.0 millimeters, less than 0.4 millimeters, less than 0.3 millimeters, less than 0.2 millimeters, greater than 0.1 millimeter, greater than 0.2 millimeters, greater than 0.3 millimeters, between 0.2 and 0.5 millimeters, between 0.30 and 0.35 millimeters, etc.). In one illustrative example, both the length 212 and width 214 may be less than 0.5 millimeters. Both the length 212 and width 214 may be between 0.30 and 0.35 millimeters.

During operation of LED array 36, the driver ICs may be operable in an addressing phase (sometimes referred to as an initialization phase). During the addressing phase, signal lines 108 assign addresses (e.g., from an external controller) to the driver ICs. The addresses may be propagated through driver ICs within a given column. In other words, during the addressing phase each driver IC (except for the last driver IC in the chain) provides an output on pin P1 that is received by an adjacent driver ICs pin P4 (e.g., through a digital signal line that is coupled between the pins). In some embodiments, the same packet of information may be passed through the driver ICs. In other embodiments, the packet may be modified by a given driver IC before being passed to the next driver IC in the chain.

During the initialization phase, brightness values may be provided to the driver ICs using signal lines 104. The brightness values may include a plurality of brightness values, with each brightness value corresponding to a respective LED zone 102. The driver IC may receive a packet with brightness values, parse the packet to determine its corresponding brightness value, and update its target LED brightness to be equal to the newly received brightness value. The driver IC may select the appropriate brightness value out of multiple brightness values within the packet based on the assigned address received via signal path 108. A single packet with the brightness values may be provided to the entire LED pixel array, different packets may be provided on each bus, or different packets may be provided to each display IC column. Having more unique packets may reduce the amount of data that needs to be included in each packet.

After the initialization is complete, the driver IC may switch from the initialization mode to a normal mode (sometimes referred to as a display mode). During the normal mode, each driver IC controls its associated LED zone 102 to emit light with the brightness that was received via the brightness data at pin P3. To control the brightness of the LED zone 102, the display IC sinks a given amount of current to ground at pin P2. The display IC may include, for example, a drive transistor that controls the amount of current that is allowed to pass through the LEDs in zone 102 and therefore controls the brightness of the LEDs.

Figure 10:
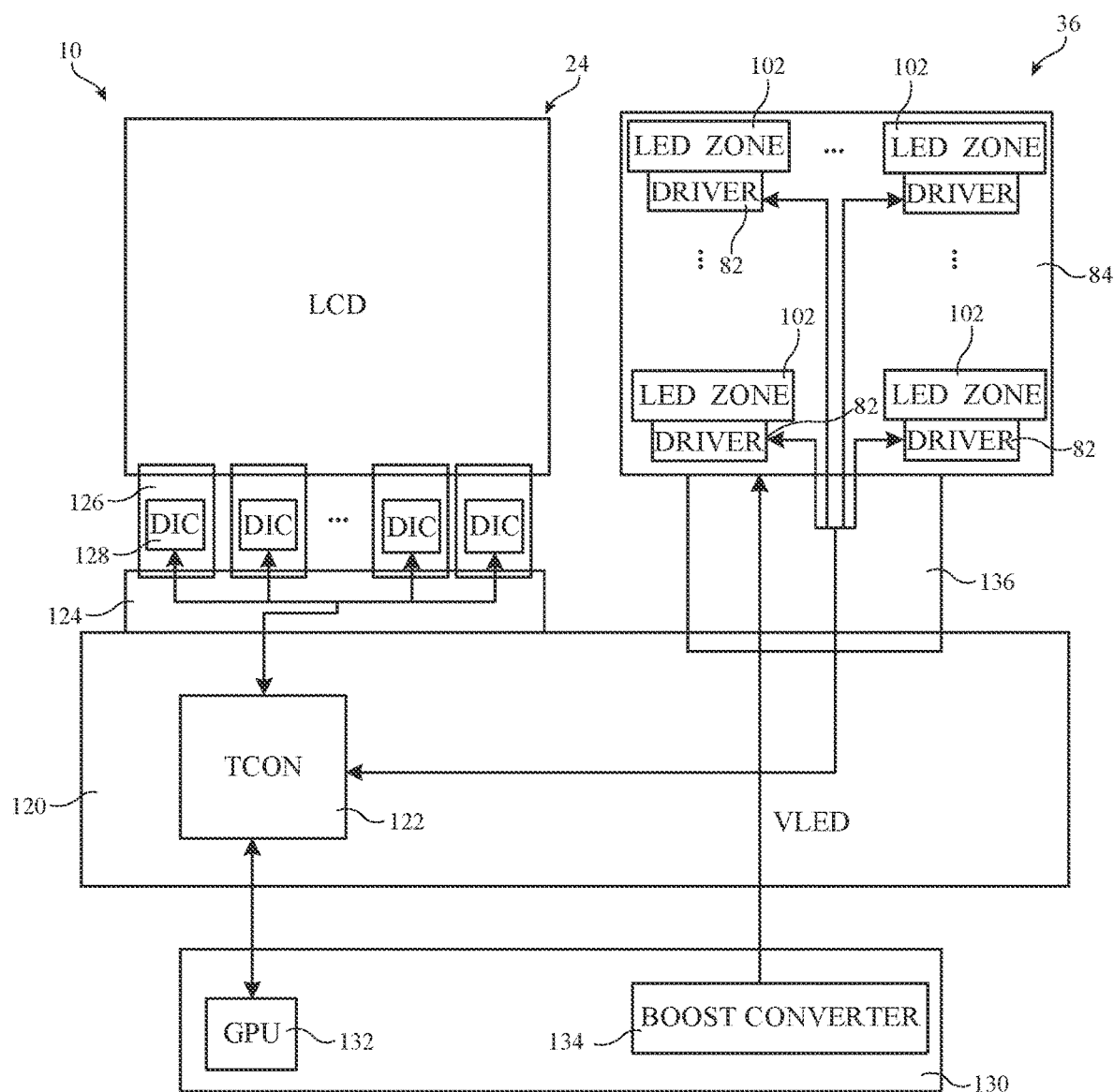
FIG. 10 is a schematic diagram of an illustrative display with a timing controller that provides signals directly to LED driver ICs in the active area in accordance with an embodiment.

There are numerous control schemes that may be used to operate the LED array of FIG. 9. In one embodiment, a timing controller (TCON) may be used to control the LED array. FIG. 10 is a schematic diagram of an illustrative electronic device with a timing controller that controls the LED array 36 of backlight 42. As shown in FIG. 10, electronic device 10 may include a timing controller 122 (TCON) on a substrate such as circuit board 120. Circuit board 120 may be a flexible printed circuit board or a rigid printed circuit board. Timing controller 122 may receive information from a graphics processing unit 132 (GPU) on main logic board 130. Main logic board 130 may be a rigid printed circuit board in one example. GPU 132 may provide data for display 14 to the timing controller 122. Timing controller 122 controls the pixel array 24 and LED array 36 (of the backlight) to display the data.

To control the pixel array 24, the timing controller 122 may use display driver integrated circuits 128. The display driver integrated circuits 128 (similar to display driver integrated circuits 62A/62B in FIG. 3) may be configured to adjust the liquid crystal display pixels of pixel array 24 on a per-pixel basis. The pixels may be adjusted to pass different amounts of light to achieve a desired per-pixel transparency and corresponding brightness. Each display driver integrated circuit 128 may control a corresponding subset of the pixels in pixel array 24.

Each display driver integrated circuit may be positioned on a respective flexible printed circuit 126, as shown in FIG. 10. There may be one or more optional daughter boards 124 coupled between the flexible printed circuits 126 and circuit board 120. In general, the depiction of printed circuits 126 and 124 in FIG. 10 is merely illustrative. Any desired connection scheme (e.g., with any desired number of intervening circuit boards, connectors, signal lines, etc.) may be used to couple pixel array 24 to display driver integrated circuits 128. Similarly, any desired connection scheme (e.g., with any desired number of intervening circuit boards, connectors, signal lines, etc.) may be used to couple the display driver integrated circuits 128 to timing controller 122.

Timing controller 122 may control LED array 36 in unison with pixel array 24. For example, for a given frame of image data, the timing controller 122 may send pixel values to display driver ICs 128 for pixel array 24 and may send LED brightness values to LED driver ICs 82 for LED zones 102. In FIG. 10, timing controller 122 sends signals directly to driver ICs 82 on substrate 84. A connecting structure (e.g., a flexible printed circuit) 136 may be coupled between circuit board 120 and LED substrate 84. The connecting structure may pass signals from the timing controller 122 to the drivers 82 (and optionally from the drivers 82 back to the timing controller 122).

FIG. 10 also shows how main logic board 130 may include a boost converter 134 that is configured to provide a power supply voltage (e.g., VLED) to LED array 36. The various printed circuits shown in FIG. 10 may be electrically connected using solder, signal paths, vias, pins, etc.

The number of signal lines between timing controller 122 and LED array 36 may be proportional to the number of driver ICs included in the LED array. As the size and density of the LED array increases, the number of driver ICs included may increase. Increasing the number of driver ICs increases the number of signal paths required. Routing a high number of signal paths between the timing controller 122 and driver ICs may be challenging due to the limited space available to include all of the desired signal paths. When the number of LED driver ICs 82 is sufficiently small, the timing controller 122 may still send signals directly to the driver ICs. However, as the number of LED driver ICs increases, it may become preferred to provide a dedicated backlight controller for controlling the LED driver ICs 82.

Figure 11:
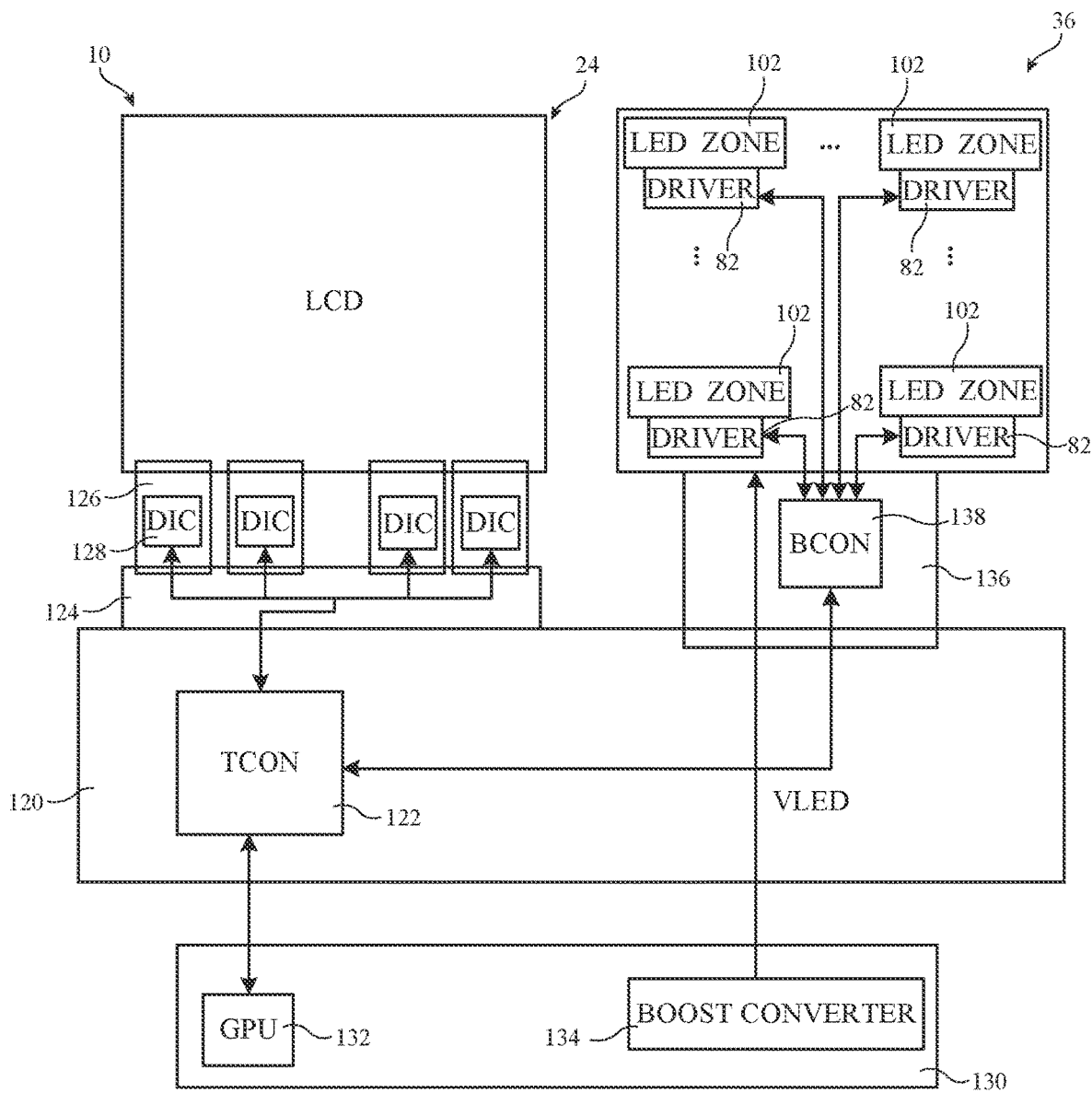
FIG. 11 is a schematic diagram of an illustrative display with a timing controller that provides signals to a backlight controller that then provides signals directly to LED driver ICs in the active area in accordance with an embodiment.

FIG. 11 is a schematic diagram of an illustrative electronic device with a backlight controller that controls the LED array 36 of backlight 42. The arrangement of FIG. 11 is the same as previously shown in FIG. 10, except for the presence of backlight controller 138 (BCON) between timing controller 122 and LED driver ICs 82. The backlight controller 138 may be mounted on connecting structure 136 (e.g., a flexible printed circuit) and may receive signals from timing controller 122. Based on the signals from timing controller 122, backlight controller 138 provides signals to the driver ICs 82.

The presence of backlight controller 138 may allow for a reduction of the number of signal paths between the timing controller and the LED driver ICs 82. Between timing controller 122 and backlight controller 138, the number of signal paths may be reduced. Backlight controller 138 may, based on the signals from the TCON, provide the full complement of signals to driver ICs 82. However, the full signal path routing is only required in a smaller area (between the BCON and the driver ICs). This may mitigate routing and fan-out issues between the LED array 36 and timing controller 122.

The arrangements of FIGS. 10 and 11 are merely illustrative. In general, the components of LED array 36, pixel array 24, and the corresponding control circuitry (such as BCON 138, TCON 122, GPU 132, boost converter 134) may be arranged on any desired number and type of substrates in any desired combination. The components may be electrically connected using any combination of solder, signal paths, vias, pins, etc.

Figure 12:
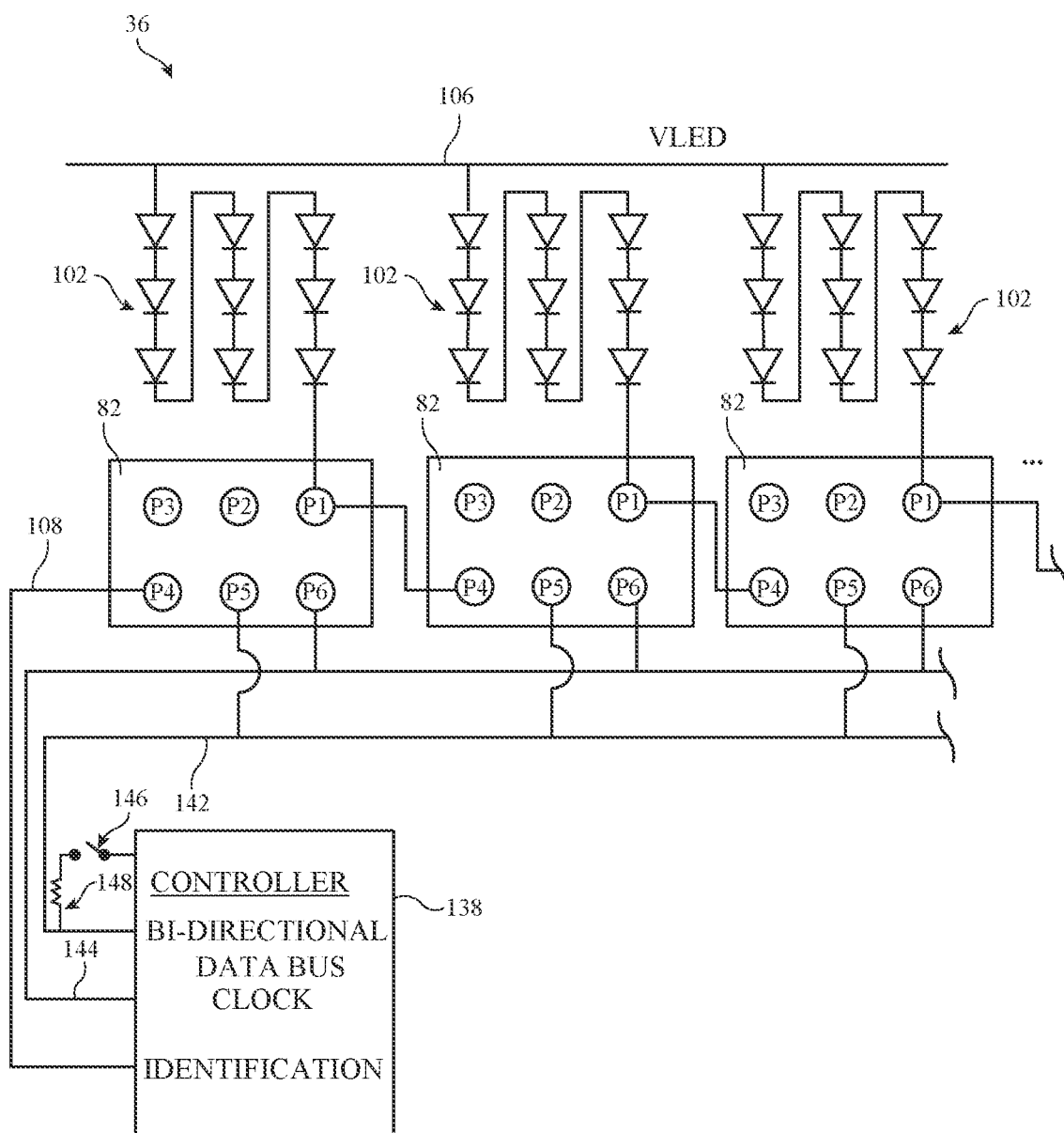
FIG. 12 is a schematic diagram of an illustrative LED array with driver ICs that have six pins in accordance with an embodiment.

In the example of FIG. 9, each LED driver integrated circuit has four pins. Minimizing the number of pins in each driver IC may advantageously minimize routing on the LED substrate 84. Fewer pins in the driver ICs may also allow the driver ICs to be less complex, and therefore smaller and less expensive to manufacture. However, if desired, the number of pins in each driver IC may be increased for added functionality. FIG. 12 is an example of an LED array where each driver IC 82 has six pins (P1, P2, P3, P4, P5, and P6). Similar to as shown in FIG. 9, each driver IC controls the brightness of an associated LED zone 102.

The function of pins P1-P4 may be similar in FIG. 12 as in FIG. 9. Pin P1 may again serve as an output pin for each driver IC 82. The light-emitting diodes of zone 102 are coupled between power supply line 106 and pin P1 of the driver IC. The output pin P1 is also coupled to the input pin P4 of the next driver IC in the chain, as discussed in connection with FIG. 9. Pin P2 may be coupled to ground. Pin P4 may receive identification information (e.g., addressing information) from controller 138 (e.g., via signal line 108). P3 may receive brightness values similar to as discussed in connection with FIG. 9. The example in FIG. 12 of the controller being backlight controller 138 is merely illustrative. As shown in FIG. 10, the driver ICs 82 may instead be directly controlled by timing controller 122 if desired.

In FIG. 12, the driver ICs also have a pin P5 that is coupled to a bi-directional data signal line. The bi-directional data signal line 142 may be used for providing control signals or data from controller 138 to the driver ICs. Alternatively, the bi-directional data signal line 142 may be used to convey feedback information from the driver ICs to controller 138. For example, the driver ICs may send diagnostic information to the controller such as a flag indicating the presence of a short-circuit, a status of whether or not the driver IC is receiving sufficient voltage, etc. In some embodiments, controller 138 may convey brightness values to the driver ICs via bus 142 (e.g., the brightness values may be provided to pin P5 instead of P3). In this type of arrangement, the P3 pin may optionally be omitted or may be used to receive a different type of signal.

Controller 138 may control the direction of transfer on bus 142. Controller 138 may control the direction of signal transfer using, for example, a switch 146 that is coupled between the bus (and a resistor 148) and a bias voltage supply terminal. Controller 138 may control the state of the switch 146 to control the direction of signal transfer on bus 142.

In FIG. 12, the driver ICs also have a pin P6 that is coupled to a signal line 144. Signal line 144 may be a digital signal line that is used to provide clock signals to the LED driver ICs. The clock signals may be used by controller 138 to control the timing of operation of the driver ICs.

Figure 13:
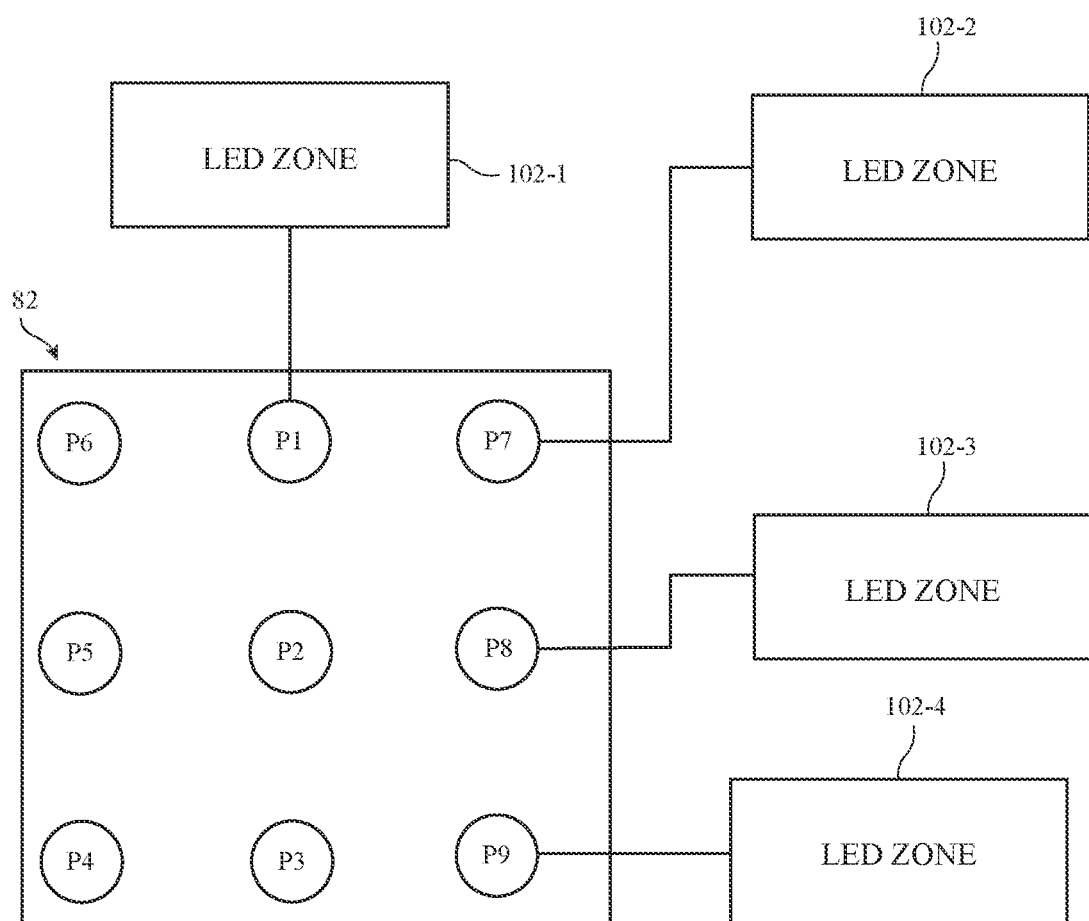
FIG. 13 is a schematic diagram of an illustrative driver IC with nine pins for independently controlling different LED zones in accordance with an embodiment.

The driver ICs of FIG. 9 and FIG. 12 each have one output pin for controlling LEDs (pin P1). This example is merely illustrative. If desired, the driver IC may include additional output pins to allow independent control of multiple LED zones. FIG. 13 is a schematic diagram of a driver IC with multiple output pins for control of multiple LED zones. As shown, LED driver IC 82 includes 9 pins (P1, P2, P3, P4, P5, P6, P7, P8, and P9). Pins P1, P2, P3, P4, P5, and P6 may have the same functions as discussed in connection with FIGS. 9 and 12. Pins P7, P8, and P9 may serve as additional output pins for control of additional LED zones. For example, output pin P1 may be used to control LED zone 102-1 (e.g., current is passed through the LEDs in zone 102-1 to ground through output pin P1 and ground pin P2). Additional output pin P7 may be used to control LED zone 102-2 (e.g., current is passed through the LEDs in zone 102-2 to ground through output pin P7 and ground pin P2). Additional output pin P8 may be used to control LED zone 102-3 (e.g., current is passed through the LEDs in zone 102-3 to ground through output pin P8 and ground pin P2). Additional output pin P9 may be used to control LED zone 102-4 (e.g., current is passed through the LEDs in zone 102-4 to ground through output pin P9 and ground pin P2).

By including the additional output pins, a single LED driver IC is enabled to control multiple LED zones to have different brightness values. For example, in FIG. 13, LED zones 102-1, 102-2, 102-3, and 102-4 may all have unique brightness magnitudes, as controlled by the driver IC 82. Enabling multi-zone control in this way may reduce the number of total driver ICs required in the LED array. However, the complexity and size of each individual driver IC will increase. The number of pins selected for the LED driver ICs in a display may therefore depend on the particular design constraints for that display.

The example in FIG. 9 and FIG. 12 of each LED zone including 9 LEDs is merely illustrative. In general, each LED zone may include any desired number of LEDs (e.g., a single light-emitting diode, a pair of light-emitting diodes, 2-20 light-emitting diodes, at least 2 light-emitting diodes, at least 4 light-emitting diodes, at least 8 light-emitting diodes, fewer than 5 light-emitting diodes, between 4 and 12 light-emitting diodes, between 8 and 12 light-emitting diodes, between 8 and 10 light-emitting diodes, 9 light-emitting diodes, or other desired number of light-emitting diodes). Regardless of the number of LEDs in the LED zone, the LEDs may be connected in series as shown and discussed in connection with FIG. 9 and FIG. 12.

Figure 14:
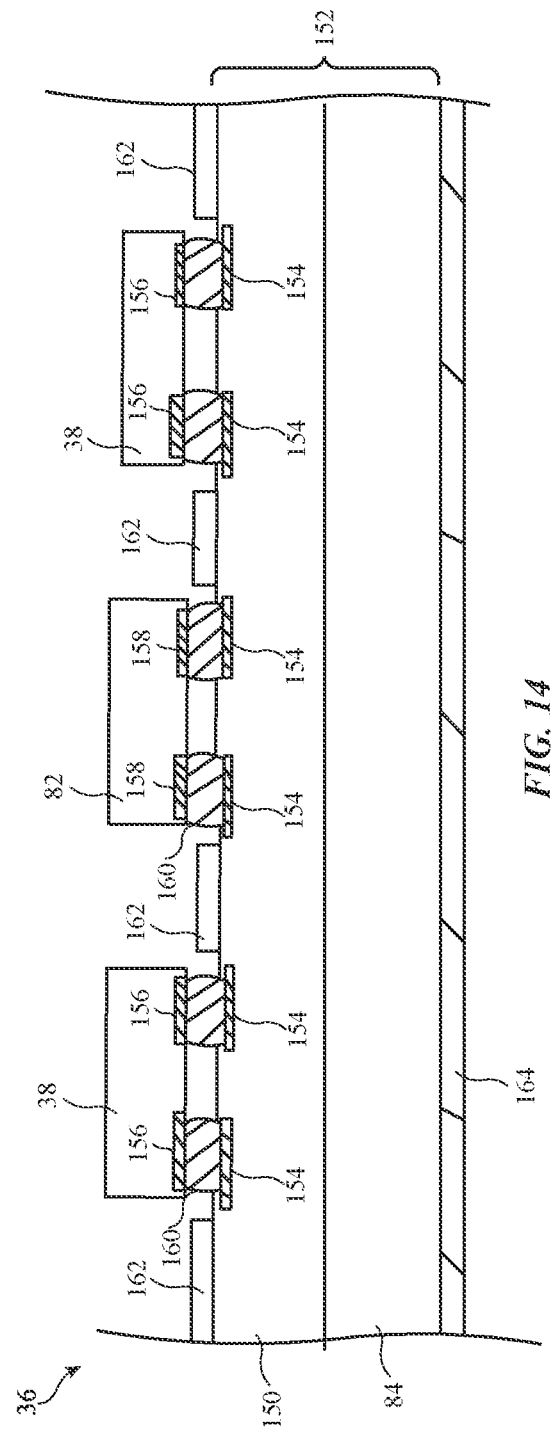
FIG. 14 is a cross-sectional side view of an illustrative LED array with both LEDs and driver ICs soldered to a glass substrate in accordance with an embodiment.

FIG. 14 is a cross-sectional side view showing how light-emitting diodes and driver ICs may be mounted to the upper surface of the substrate. As shown, LED array 36 includes a substrate 84 (e.g., formed from glass). Substrate 84 may sometimes be referred to as glass substrate 84 or glass layer 84. Circuitry layers 150 (sometimes referred to as thin-film circuitry may be formed on the glass layer 84. Circuitry layers 150 may include one or more conductive layers that are deposited on glass layer 84. The circuitry layers 150 may be patterned to form traces that follow desired paths (e.g., to form signal lines as in FIG. 9). In one example, circuitry layers 150 includes first and second conductive layers with an intervening insulating layer. Glass layer 84 and circuitry layers 150 may sometimes collectively be referred to as thin-film layer 152, thin-film glass 152, thin-film circuitry layer 152, thin-film circuitry glass 152, glass substrate 152, LED substrate 152, glass LED substrate 152, etc. In other words, the term glass substrate may be used to refer to both the individual layer of glass itself (e.g., glass substrate 84) and the collective combination of a glass layer and conductive layers to which the LEDs are mounted (e.g., glass substrate 152).

As shown in FIG. 14, circuitry layers 150 may include contact pads 154 (sometimes referred to as input-output contacts 154, solder pads 154, etc.). The contact pads may be electrically connected to mounted components by solder 160. As shown in FIG. 14, light-emitting diode 38 is mounted on glass substrate 152 and is electrically connected to contact pads 154 by solder 160. In particular, light-emitting diode 38 has input-output contacts 156 (e.g., pins, solder pads, etc.) that are attached to contact pads 154 with solder 160. Driver integrated circuit 82 is mounted on glass substrate 152 and is electrically connected to contact pads 154 by solder 160. In particular, driver IC 82 has input-output contacts 158 (e.g., pins, solder pads, etc.) that are attached to contact pads 154 with solder 160. As shown in FIG. 14, driver IC 82 may be mounted to thin-film circuitry glass 152 between LEDs 38 in the active area of the display.

In the example of FIG. 14, LEDs 38 and driver ICs 82 may be surface mount technology (SMT) components. This example is merely illustrative, and other mounting techniques may be used to attach LEDs 38 and driver ICs 82 to thin-film circuitry glass 152. One advantage of the arrangement of FIG. 14 is that LEDs 38 and driver ICs 82 may be attached to the thin-film circuitry glass 152 in a single mounting step. In other words, because the LEDs 38 and driver ICs 82 have a similar size and are soldered to the thin-film circuitry glass in a similar manner, the attachment process for both LEDs 38 and driver ICs 82 may be performed simultaneously. This is advantageous for reducing the manufacturing cost and complexity associated with the LED array.

To improve the efficiency of the backlight, a reflective layer 162 may be formed on an upper surface of thin-film circuitry glass 152. Reflective layer 162 may be patterned to fill portions of the upper surface of thin-film circuitry glass 152 not already occupied by LEDs 38 and driver ICs 82. Said another way, the LEDs 38 and driver ICs 82 are formed in openings in the reflective layer 162.

The reflective layer 162 may be formed from any desired material. As one example, the reflective layer may be formed from a diffusive white material (e.g., a white ink spray or a white tape). This example is merely illustrative. In general, reflective layer 162 may cause diffuse reflection and/or specular reflection. In diffusive reflection, an incident ray of light may be reflected in any direction. In specular reflection, an incident ray of light will be reflected at the same angle it strikes the reflective material. Reflective layer 162 may be formed form a metal coating that causes specular reflection, as another example. Reflective layer 162 may have a high reflectance of the light emitted by LEDs 38 (e.g., greater than 50%, greater than 70%, greater than 80%, greater than 90%, greater than 92%, greater than 94%, greater than 96%, greater than 99%, less than 99%, etc.). The reflective layer 162 may have any desired thickness (e.g., greater than 1 micron, greater than 2 microns, greater than 3 microns, greater than 5 microns, greater than 10 microns, greater than 25 microns, less than 3 microns, less than 5 microns, less than 10 microns, less than 25 microns, less than 100 microns, between 3 and 15 microns, between 1 and 25 microns, etc.). Reflective layer 162 may sometimes be referred to as white overcoat layer 162.

Thermal considerations may also be taken into account in backlight 42 with LED array 36. In particular, the components of LED array 36 (e.g., the LEDs 38 and driver ICs 82) may generate heat during operation of the display. If care is not taken, the heat generation may adversely affect performance of the display. The glass substrate 84 may have a low thermal conductivity. Consequently, the heat generated by the components may not be evenly spread across the array.

To promote heat spreading across the backlight, a thermally conductive layer 164 may be attached to substrate 84. Thermally conductive layer 164 may have a high thermal conductivity and thus more evenly spreads heat across the backlight. Thermally conductive layer 164 may be formed from any desired material. Thermally conductive layer 164 may have a thermal conductivity of greater than 100 W/mK, greater than 200 W/mK, greater than 300 W/mK, greater than 400 W/mK, between 100 W/mK and 400 W/mK, or another desired thermal conductivity. Examples of materials that may be used for forming thermally conductive layer 164 (sometimes referred to as heat spreading layer 164) include metal (e.g., copper, other metals, or combinations of copper and other metals), carbon nanotubes, graphite, or other materials that exhibit high thermal conductivity. If desired, heat spreading layer 164 may be formed from two or more thermally conductive layers of different types (e.g., a layer of copper attached to a layer of graphite, etc.). Polymer carrier films may also be incorporated in layer 164 (e.g., to support a layer of graphite). In one illustrative example, heat spreading layer 164 includes a layer of graphite interposed between two polymer carrier films.

Figure 15:
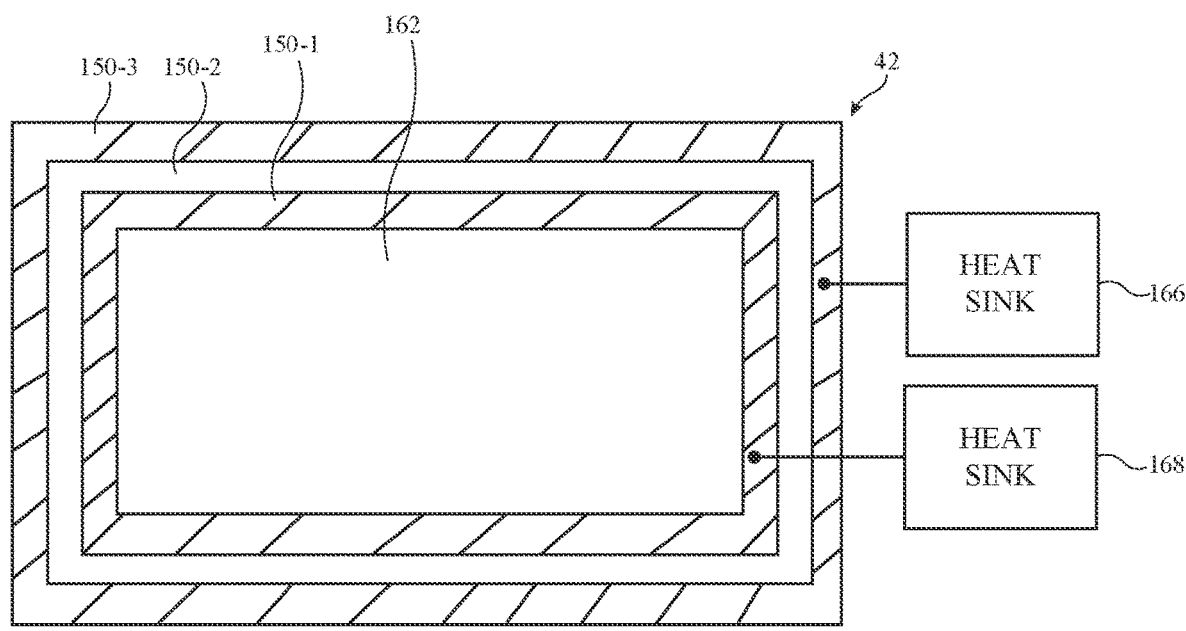
FIG. 15 is a top view of an illustrative backlight showing how conductive layers on a glass substrate may be exposed and connected to heat sinks in accordance with an embodiment.
Figure 16:
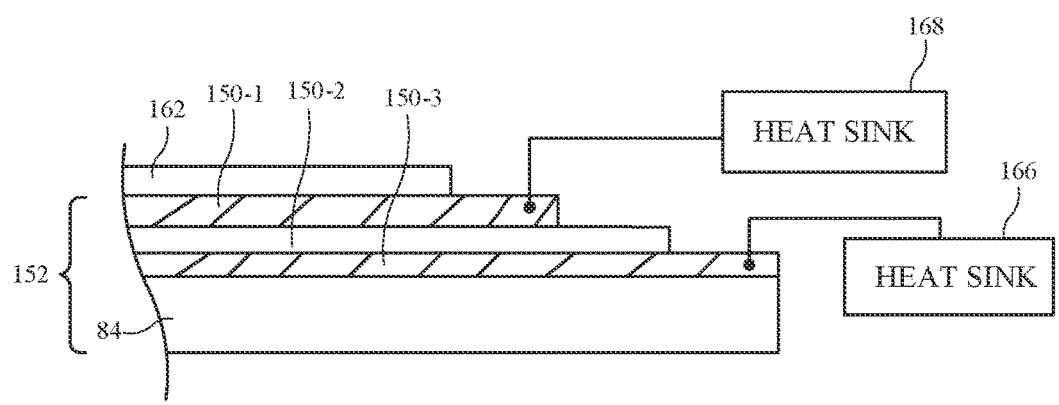
FIG. 16 is a cross-sectional side view of the illustrative backlight of FIG. 15 in accordance with an embodiment.

An additional technique for distributing heat from the backlight is shown in FIGS. 15 and 16. FIG. 15 is a top view of an illustrative backlight 42 with exposed conductive layers. Specifically, reflective layer 162 may be etched at the periphery of the backlight to expose underlying conductive layer 150-1 in circuitry layers 150. LEDs 38 and driver ICs 82 may also be formed in recesses in reflective layer 162, as shown in FIG. 14. The exposed portion of conductive layer 150-1 extends in a ring around reflective layer 162. A conductive layer 150-3 may be separated from conductive layer 150-1 by insulating layer 150-2. Conductive layer 150-1 and insulating layer 150-2 may be etched at the periphery of the backlight to expose underlying conductive layer 150-3. The exposed portion of conductive layer 150-3 extends in a ring around conductive layer 150-1 and reflective layer 162.

The exposed portions of conductive layers 150-1 and 150-3 may be coupled to heat sinks for additional heat dispersion. As shown in FIG. 15, conductive layer 150-3 is coupled to heat sink 166 and conductive layer 150-1 is coupled to heat sink 168. Heat sinks 166 and 168 may be formed from any desired material or component (e.g., a component of the electronic device that serves an additional function such a metal housing component, a dedicated heat sink with fins, etc.). The heat sinks may be attached to conductive layers 150-1 and 150-3 with thermally conductive paste, in one example. Heat sinks 166 and 168 may sometimes be referred to as heat sink structures. The example of FIG. 15 with conductive layers 150-1 and 150-3 connected to discrete heat sinks is merely illustrative. In another example, exposed conductive layers 150-1 and 150-3 of thin-film circuitry glass 152 may be coupled to a single heat sink structure.

FIG. 16 is a cross-sectional side view of the backlight shown in FIG. 15. As shown in FIG. 16, conductive layer 150-3 is deposited on an upper surface of glass layer 84. Insulating layer 150-2 is deposited on conductive layer 150-3. Conductive layer 150-1 is deposited on insulating layer 150-2. Reflective layer 162 is deposited on conductive layer 150-1. An exposed portion of conductive layer 150-3 is coupled to heat sink 168 and an exposed portion of conductive layer 150-1 is coupled to heat sink 166.

Figure 17:
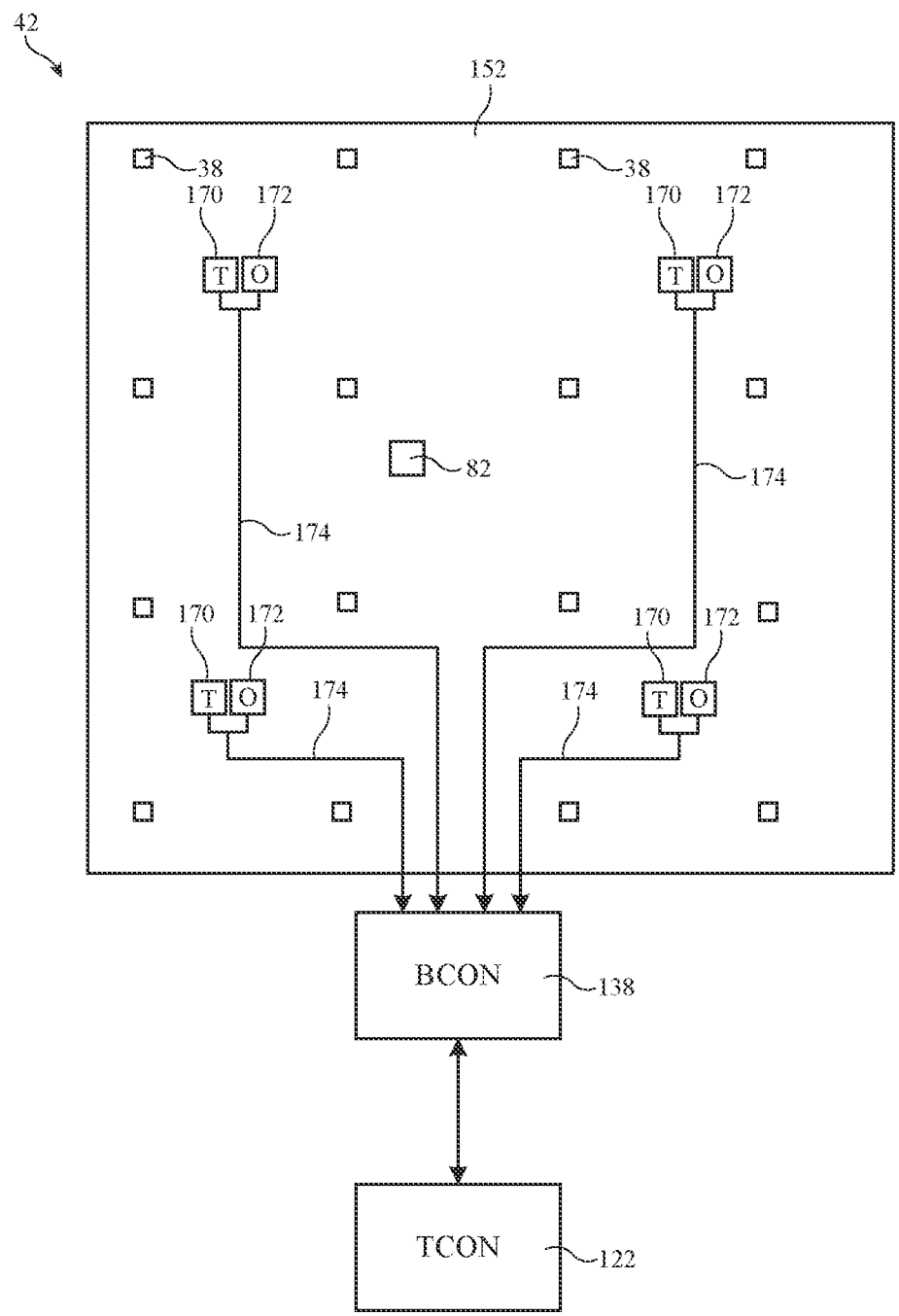
FIG. 17 is a top view of an illustrative backlight showing how temperature and optical sensors may be distributed across the active area of the backlight in accordance with an embodiment.

In addition to the techniques of FIGS. 14-16 for promoting heat spreading and dispersion, the backlight may include temperature sensors for active temperature sensing. As shown in FIG. 17, temperature sensors 170 may be distributed across the active area of the backlight on thin-film circuitry glass 152. The temperature sensors may provide temperature data to backlight controller 138 using signal paths 174. The backlight controller 138 may provide the temperature data to timing controller 122. The temperature data from the temperature sensors across the backlight may allow for a 2D thermal profile to be determined for the backlight. The 2D thermal profile of temperature across thin-film circuitry glass 152 may be used to allow for real time optical compensation based on temperature. For example, the performance of the LEDs 38 in backlight 42 and the pixels in pixel array 24 may be dependent upon the operating temperature. Using the operating temperature from the 2D thermal profile, the LEDs and pixels may be operated to exhibit desired brightness values in the real-time temperature conditions.

Each temperature sensor may be formed using any desired technique. In one possible arrangement, the temperature sensor 170 may be a four-point resistive sensor that measures temperature based on changes in the resistance of thin-film traces on thin-film circuitry glass 152. In other words, the temperature sensor may be formed from metal traces on the glass substrate (e.g., deposited using physical vapor deposition or other desired techniques).

In the example of FIG. 17, a temperature sensor 170 is formed between each group of four light-emitting diodes. This example is merely illustrative. In general, the temperature sensors 170 may be distributed across the LED array in any desired pattern. The temperature sensors may be distributed with a uniform density across the array or with a non-uniform density across the array. The ratio of LEDs to temperature sensors may be 4 to 1 (as in FIG. 17) or any other desired ratio (e.g., 1 to 1, 2 to 1, 3 to 1, more than 4 to 1, more than 8 to 1, more than 10 to 1, more than 25 to 1, more than 50 to 1, less than 8 to 1, less than 10 to 1, less than 25 to 1, less than 50 to 1, less than 100 to 1, between 1 to 1 and 10 to 1, between 2 to 1 and 5 to 1, between 4 to 1 and 100 to 1, etc.).

The backlight may also include optical sensors for real time sensing of LED brightness and/or color. As shown in FIG. 17, optical sensors 172 may be distributed across the active area of the backlight on thin-film circuitry glass 152. The optical sensors may provide optical data to backlight controller 138 using signal paths 174. The backlight controller 138 may provide the optical data to timing controller 122. The optical data from the optical sensors across the backlight may allow for a 2D profile of brightness and color to be determined for the backlight. The 2D optical profile across thin-film circuitry glass 152 may be used to allow for real time optical compensation. For example, the operation of the LEDs and pixels may account for the real time optical conditions. As one non-limiting example, the optical sensor may provide data indicating that a given LED has a brightness that is lower than expected. The timing controller may, in response, increase the brightness of that LED until the target brightness level is reached. Each optical sensor may include any desired components for measuring brightness levels. The optical sensor may have multiple color channels, different optical sensors may have different color channels, all of the optical sensors may have the same, single color channel, etc.

In the example of FIG. 17, an optical sensor 172 is formed between each group of four light-emitting diodes. This example is merely illustrative. In general, the optical sensors 172 may be distributed across the LED array in any desired pattern. The optical sensors may be distributed with a uniform density across the array or with a non-uniform density across the array. The ratio of LEDs to optical sensors may be 4 to 1 (as in FIG. 17) or any other desired ratio (e.g., 1 to 1, 2 to 1, 3 to 1, more than 4 to 1, more than 8 to 1, more than 10 to 1, more than 25 to 1, more than 50 to 1, less than 8 to 1, less than 10 to 1, less than 25 to 1, less than 50 to 1, less than 100 to 1, between 1 to 1 and 10 to 1, between 2 to 1 and 5 to 1, between 4 to 1 and 100 to 1, etc.).

Also, in FIG. 17 there is an equal number of temperature sensors 170 and optical sensors 172. This example is merely illustrative. In general, the number and position of the temperature and optical sensors may be selected independently. There may therefore be different numbers of temperature and optical sensors if desired, and the temperature and optical sensors may be positioned in different patterns across the active area if desired.

Figure 18:
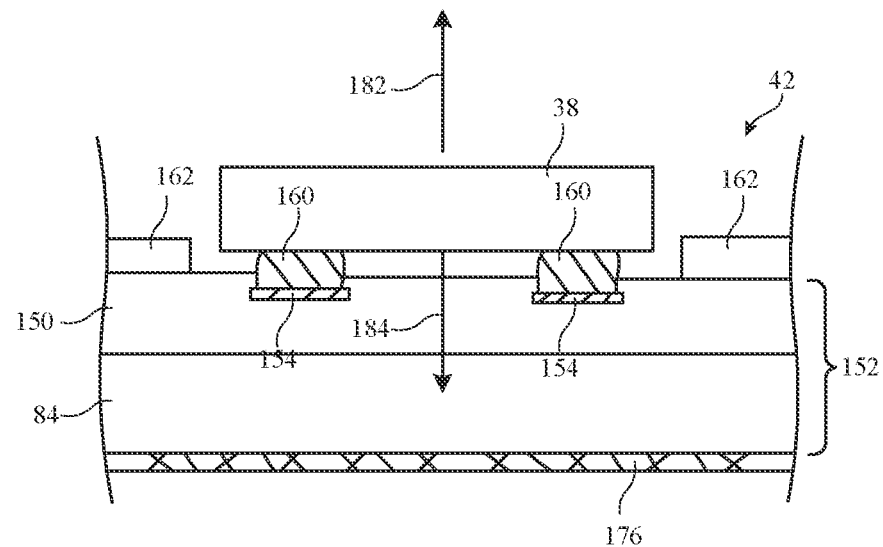
FIG. 18 is a cross-sectional side view of an illustrative backlight showing how a reflective layer may be attached to the lower surface of a glass LED substrate in accordance with an embodiment.

In addition to a reflective layer (162) on the upper surface of thin-film circuitry glass 152, a reflective layer may be included on the lower surface of thin-film circuitry glass 152. FIG. 18 is a cross-sectional side view of an illustrative backlight that includes a reflective layer attached to a lower surface of the thin-film circuitry glass. As shown, reflective layer 176 is attached to the lower surface of thin-film circuitry glass 152. Reflective layer 176 may increase the efficiency of the backlight by reflecting light from light-emitting diode 38.

As previously discussed in connection with FIG. 14, LED 38 may be attached to input-output contacts 154 in circuitry layer 150 by solder 160. LED 38 may emit light in direction 182 (e.g., through pixel array 24 toward a viewer). However, LED 38 may also emit light in direction 184 (away from the pixel array and viewer). Without reflective layer 176, the light emitted in direction 184 may be lost within the electronic device and fail to reach the viewer. To avoid this decrease in efficiency, reflective layer 176 may be present to redirect the light back in direction 182 through the pixel array. Reflective layer 176 is attached to the opposite side of glass substrate 84 as the LEDs 38 and driver ICs 82.

Reflective layer 176 may be formed from any desired material. As one example, the reflective layer may be formed from a diffusive white material (e.g., a white ink spray or a white tape). This example is merely illustrative. Reflective layer 176 may be formed from a metal coating, as another example. In general, reflective layer 176 may cause diffuse reflection and/or specular reflection. Reflective layer 176 may have a high reflectance of the light emitted by LEDs 38 (e.g., greater than 50%, greater than 70%, greater than 80%, greater than 90%, greater than 92%, greater than 94%, greater than 96%, greater than 99%, less than 99%, etc.). The reflective layer 176 may have any desired thickness (e.g., greater than 1 micron, greater than 2 microns, greater than 3 microns, greater than 5 microns, greater than 10 microns, greater than 25 microns, less than 3 microns, less than 5 microns, less than 10 microns, less than 25 microns, less than 100 microns, between 3 and 15 microns, between 1 and 25 microns, between 1 and 5 microns, etc.). Reflective layer 176 may be a coating or may be a layer of tape. Reflective layer 176 may sometimes be described as reflective coating 176 or reflective tape 176.

Figure 19:
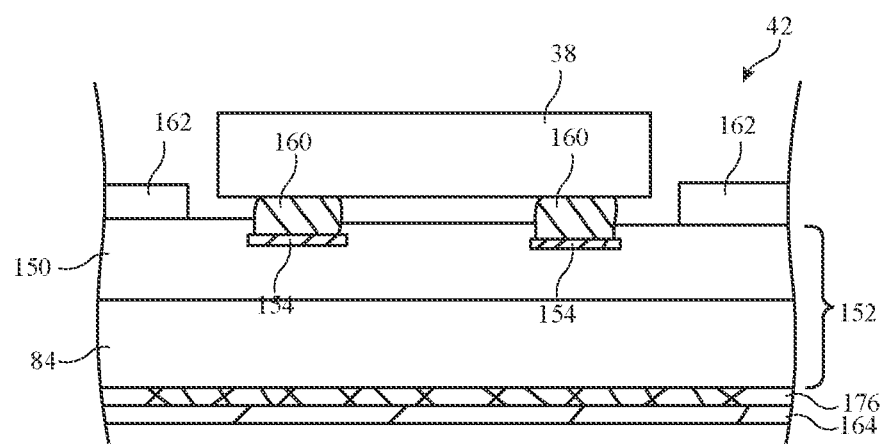
FIG. 19 is a cross-sectional side view of an illustrative backlight showing how a reflective layer and a separate thermally conductive layer may be attached to the lower surface of a glass LED substrate in accordance with an embodiment.

FIG. 19 is a cross-sectional side view of a backlight that includes both a reflective layer and a thermally conductive layer attached to the lower surface of the glass substrate. As shown in FIG. 19, reflective layer 176 may be attached to the lower surface of glass substrate 84. Reflective layer 176 may increase the optical efficiency of the backlight unit. Additionally, thermally conductive layer 164 (as discussed in connection with FIG. 14) is attached to the reflective layer, such that the reflective layer 176 is interposed between the lower surface of glass substrate 84 and the thermally conductive layer 164. Thermally conductive layer 164 may provide heat spreading benefits in addition to the efficiency benefits from reflective layer 176.

Figure 20:
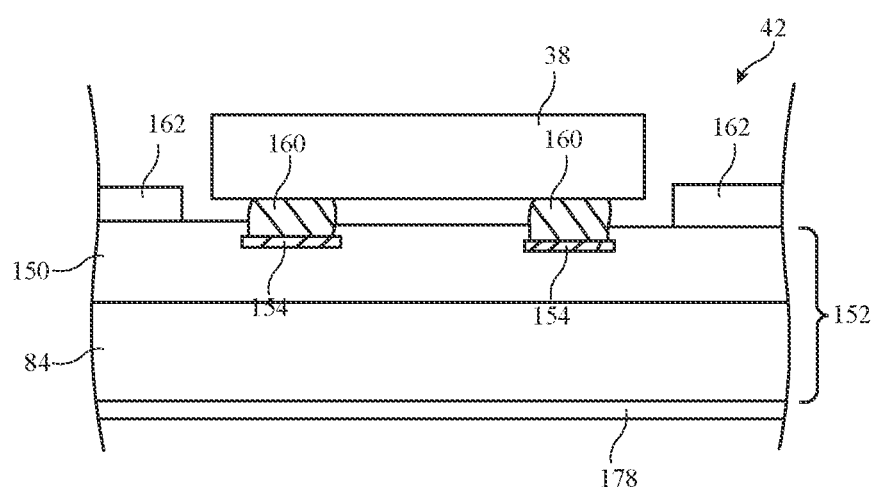
FIG. 20 is a cross-sectional side view of an illustrative backlight showing how a reflective and thermally conductive layer may be attached to the lower surface of a glass LED substrate in accordance with an embodiment.

In yet another example, shown in the cross-sectional side view of FIG. 20, a single reflective and thermally conductive layer 178 may be attached to the lower surface of glass substrate 84 (instead of separate reflective and thermally conductive layers 176/164 as in FIG. 19). Reflective and thermally conductive layer 178 may have a high reflectivity to increase the efficiency of the backlight. For example, the reflective and thermally conductive layer 178 may have a reflectivity that is greater than 50%, greater than 70%, greater than 80%, greater than 90%, greater than 92%, greater than 94%, greater than 96%, greater than 99%, less than 99%, etc. Additionally, the reflective and thermally conductive layer 178 may have a high thermal conductivity to achieve desired heat spreading properties. Thermally conductive layer 178 may have a thermal conductivity of greater than 100 W/mK, greater than 200 W/mK, greater than 300 W/mK, greater than 400 W/mK, between 100 W/mK and 400 W/mK, or another desired thermal conductivity.

Figure 21:
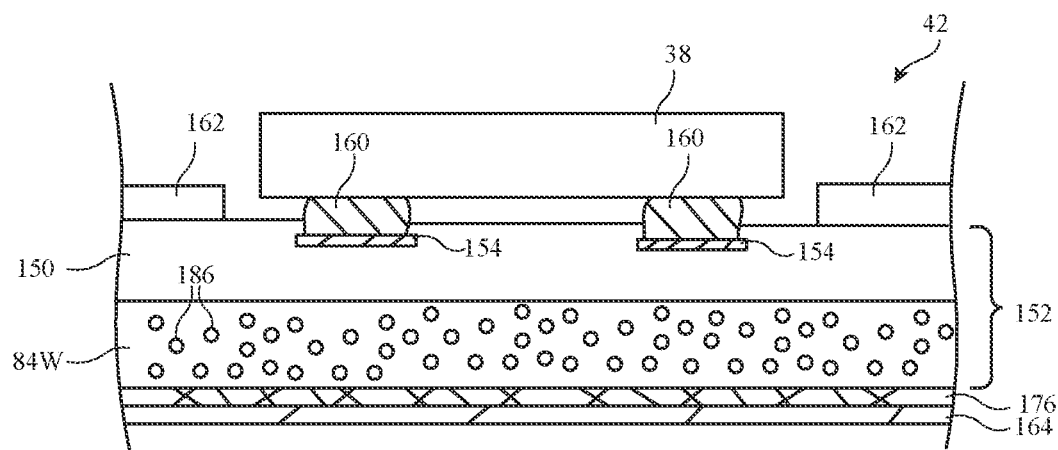
FIG. 21 is a cross-sectional side view of an illustrative backlight showing how a substrate may be formed from white diffusive glass in accordance with an embodiment.

FIG. 21 is a cross-sectional side view of an illustrative backlight showing how the glass substrate may be formed from white diffusive glass. Instead of clear glass having a high transparency, a white diffusive glass 84W may be used as the substrate for thin-film circuitry glass 152. The white diffusive glass 84W may include dispersed particles 186 (e.g., scattering particles) that achieve the desired diffusion of light. The reflectance of white diffusive glass 84W may be greater than 20%, greater than 30%, greater than 40%, greater than 50%, greater than 70%, greater than 80%, greater than 90%, greater than 92%, greater than 94%, greater than 96%, greater than 99%, less than 99%, etc.

LED driver integrated circuits 82 are distributed across the active area of the backlight between LEDs 38. Driver ICs 82 do not emit light and cover the otherwise reflective treatments on thin-film circuitry glass 152 (e.g., driver ICs 82 may prevent light from reaching reflective layer 162, reflective layer 176, etc.). If care is not taken, the driver ICs may be visible (e.g., as a shadow on the display when a purely white image is otherwise desired). To prevent the driver ICs from causing visible artifacts in the display and to increase the efficiency of the backlight, the driver ICs may have a reflective upper surface.

Figure 22:
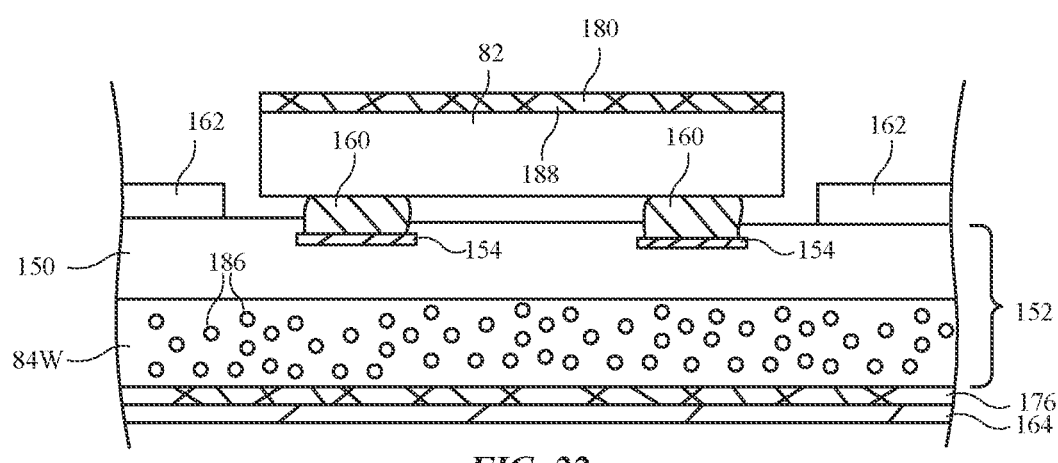
FIG. 22 is a cross-sectional side view of an illustrative backlight showing how a reflective layer may be formed on an upper surface of an LED driver IC in accordance with an embodiment.

FIG. 22 is a cross-sectional side view of an illustrative backlight having a driver IC with a reflective upper surface. As shown in FIG. 22, a reflective layer 180 may be formed on the upper surface 188 of driver IC 82. Reflective layer 180 may be formed from any desired material. As one example, the reflective layer 180 may be formed from a diffusive white material (e.g., a white ink spray or a white tape). Reflective layer 180 may be a metal coating, as another example. In general, reflective layer 180 may cause diffuse reflection and/or specular reflection. Reflective layer 180 may have a high reflectance (e.g., greater than 50%, greater than 70%, greater than 80%, greater than 90%, greater than 92%, greater than 94%, greater than 96%, greater than 99%, less than 99%, etc.). The reflective layer 180 may have any desired thickness (e.g., greater than 1 micron, greater than 2 microns, greater than 3 microns, greater than 5 microns, greater than 10 microns, greater than 25 microns, less than 3 microns, less than 5 microns, less than 10 microns, less than 25 microns, less than 100 microns, between 3 and 15 microns, between 1 and 25 microns, etc.).

The example in FIG. 22 of a separate reflective layer 180 being formed over driver IC 82 is merely illustrative. In another illustrative example, the upper surface 188 of the IC may itself be polished to increase the reflectivity of the upper surface. In this type of arrangement, the reflectance of upper surface 188 may be greater than 50%, greater than 70%, greater than 80%, greater than 90%, greater than 92%, greater than 94%, greater than 96%, greater than 99%, less than 99%, etc. When driver IC 82 does have a separate reflective layer 180, the upper surface of the reflective layer 180 may be considered to be the upper surface of the driver IC (e.g., because the reflective layer effectively forms the upper surface).

Figure 23:
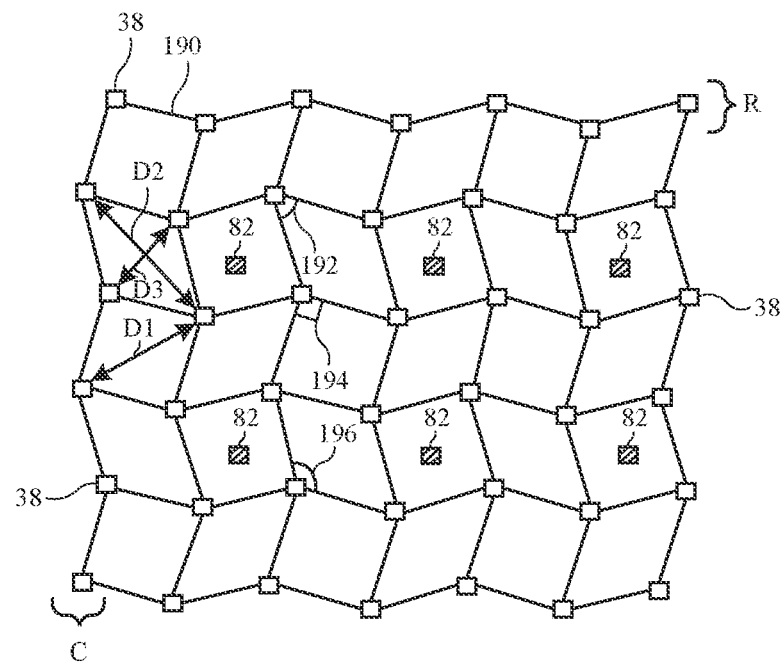
FIG. 23 is a top view of an illustrative LED array showing how the LEDs may be arranged in a zig-zag pattern in accordance with an embodiment.

FIG. 23 is a top view of an illustrative LED array showing a possible LED layout. As shown, the LEDs 38 may be arranged according to a zig-zag grid (e.g., a non-square-grid), instead of a uniform square grid. In a uniform square grid, the LEDs may be arranged in straight columns and rows (similar to as shown in FIG. 4, for example). This type of arrangement, however, may result in visible artifacts such as grid mura during operation of the display. The visible artifacts may be caused by the periodicity of the uniform square grid. Therefore, arranging the LEDs in a non-square grid as in FIG. 23 may reduce periodicity and mitigate visible artifacts.

As shown in FIG. 23, the LEDs may be arranged according to zig-zag grid lines 190. The LEDs are arranged in a number of rows ('R') and columns ('C'). Within a given row, the grid line defining the placement of the LEDs may follow a zig-zag pattern (e.g., instead of a straight line, the grid line has a plurality of segments at angles relative to each other). The grid lines that define rows of LEDs may be referred to as horizontal grid lines. Similarly, within a given column, the grid line defining the placement of the LEDs may follow a zig-zag pattern (e.g., instead of a straight line, the grid line has a plurality of segments at angles relative to each other). The grid lines that define columns of LEDs may be referred to as vertical grid lines.

The resulting pattern has horizontal and vertical grid lines that intersect at different angles relative to each other. For example, at some points, the grid lines are at a right angle (e.g., angle 194) relative to each other. At other points, however, the grid lines are at an acute angle (e.g., acute angle 192) relative to each other. At other points, the grid lines are at obtuse angles (e.g., obtuse angle 196) relative to each other. Angles 192 and 196 may be supplementary angles.

In FIG. 23, the horizontal and vertical grid lines are in a zig-zag pattern. The LEDs may therefore be referred to as being arranged in a non-square grid or non-rectangular grid (e.g., the grid lines do not form rectangles). The rows of LEDs may therefore be referred to as zig-zag rows, rows following a zig-zag pattern, or non-linear rows. Similarly, the columns of LEDs may therefore be referred to as zig-zag columns, columns following a zig-zag pattern, or non-linear columns. As a result of the zig-zag pattern of FIG. 23, there may be numerous different distances between adjacent LEDs within the display. For example, some of the LEDs may be separated by a diagonally opposite LED (e.g., in an immediately adjacent row and immediately adjacent column) by distance D1. Other LEDs may be separated from diagonally opposite LEDs by distance D2 or D3. D3 may be smaller than D1, which may be smaller than D2. This is in contrast to a square grid, where the distance between each LED and a diagonally opposite LED is uniform across the LED array.

The example of zig-zag grid lines in FIG. 23 to mitigate periodicity is merely illustrative. If desired, the grid lines and LEDs may have a hexagonal arrangement, octagonal arrangement, or any other desired arrangement. Dithering may also be used to add variance to the positions of the LEDs across the array.

Figure 24:
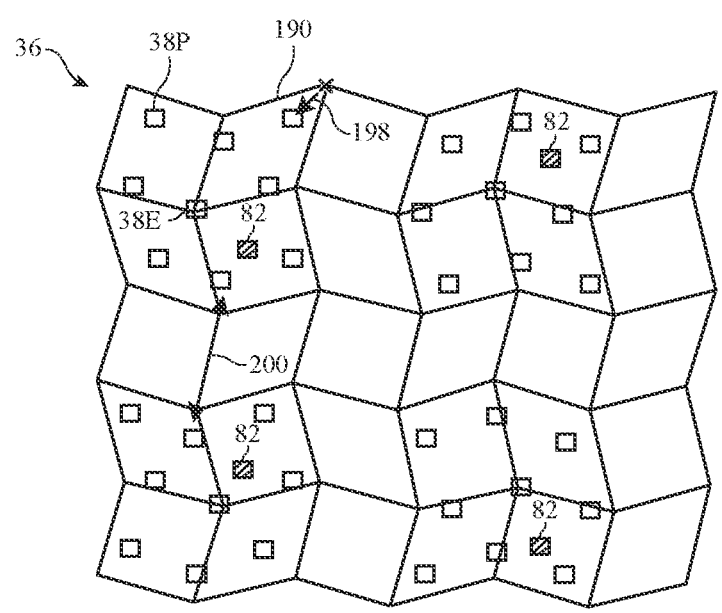
FIG. 24 is a top view of an illustrative LED array showing how the LEDs may be arranged in a zig-zag pattern with increased zone-to-zone spacing in accordance with an embodiment.

FIG. 24 is a top view of an illustrative LED array with another possible LED layout. In FIG. 24, each 3×3 group of LEDs (sometimes referred to as an LED zone 102) has a reduced layout footprint relative to in FIG. 23. Similar to as in FIG. 23, grid lines 190 in FIG. 24 include horizontal zig-zag grid lines and vertical zig-zag grid lines. However, in FIG. 23 the LEDs are positioned at the intersection points between the horizontal and vertical zig-zag grid lines. In FIG. 24, only the center LED 38E is positioned at the intersection point between the horizontal and vertical zig-zag grid lines. The peripheral LEDs of the group (38P) are moved in direction 198 from the grid line intersection towards the central LED 38E.

Arranging the LEDs in this way effectively decreases the surface area of the footprint of each LED group. Consequently, the distance 200 between each adjacent LED group is greater (e.g., distance 200 between groups is greater in FIG. 24 than in FIG. 23). Having smaller LED zones may improve backlight performance by mitigating halo effect. Halo effect may refer to the phenomenon that occurs when a small area on the display is intended to have a high brightness and be surrounded by a low brightness region (e.g., a star in a night sky). Ideally, the low brightness region would be controllable totally independently from the high brightness region. However, if both the intended high and low brightness regions occupy the area of one LED zone, there will be a bright 'halo' in the intended low brightness region (because the LED zone is set to a high brightness for the high brightness region on the display). Reducing the area of each LED zone may mitigate this halo effect (as there is more resolution to have the intended backlight brightness levels only in intended areas).

Figure 25:
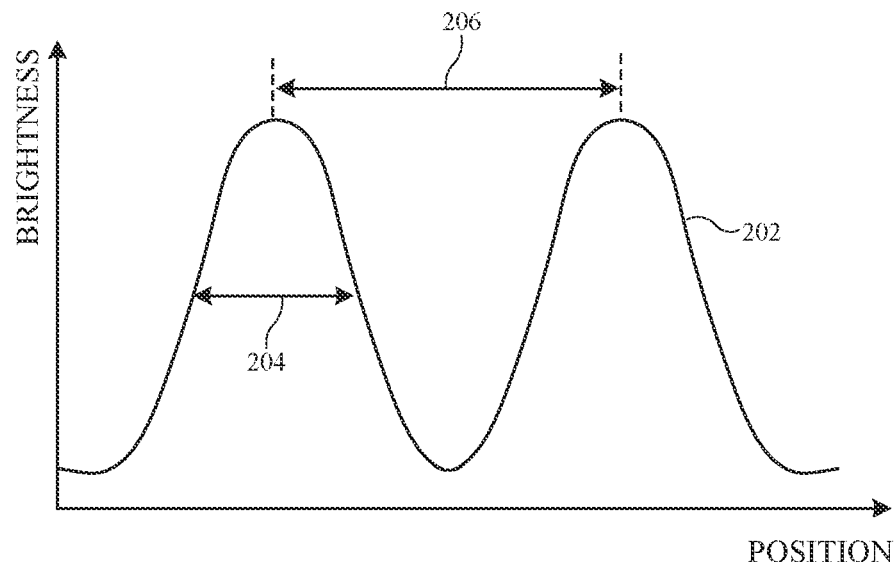
FIG. 25 is a graph of an illustrative emission profile for LED groups in a backlight in accordance with an embodiment.

The LED zones of LED array 36 may be optimized to have a target energy profile. FIG. 25 is a graph of an illustrative energy profile, showing brightness as a function of position for two LED zones. As shown, the brightness follows profile 202, with one peak for each corresponding LED zone. The distance between the peaks for the adjacent LED zones is shown as pitch 206. Another relevant property of the profile is distance 204, which is the width of the peak at a brightness that is half of the maximum brightness of the peak (referred to herein as full width half maximum or FW). The ratio of the pitch 206 (P) to the distance 204 (FW) may be a key property of the LED zones in a backlight. P/FW for the LED zones in backlight 42 (e.g., the zones of FIG. 9, FIG. 12, FIG. 23, FIG. 24, etc.) may be less than 1.3, less than 1.2, less than 1.1, greater than 1, between 1.05 and 1.2, between 1.05 and 1.15, between 1.01 and 1.2, etc. The profile shape depicted in FIG. 25 is merely illustrative. The brightness profile of a given LED zone may follow any desired shape.

Figure 26:
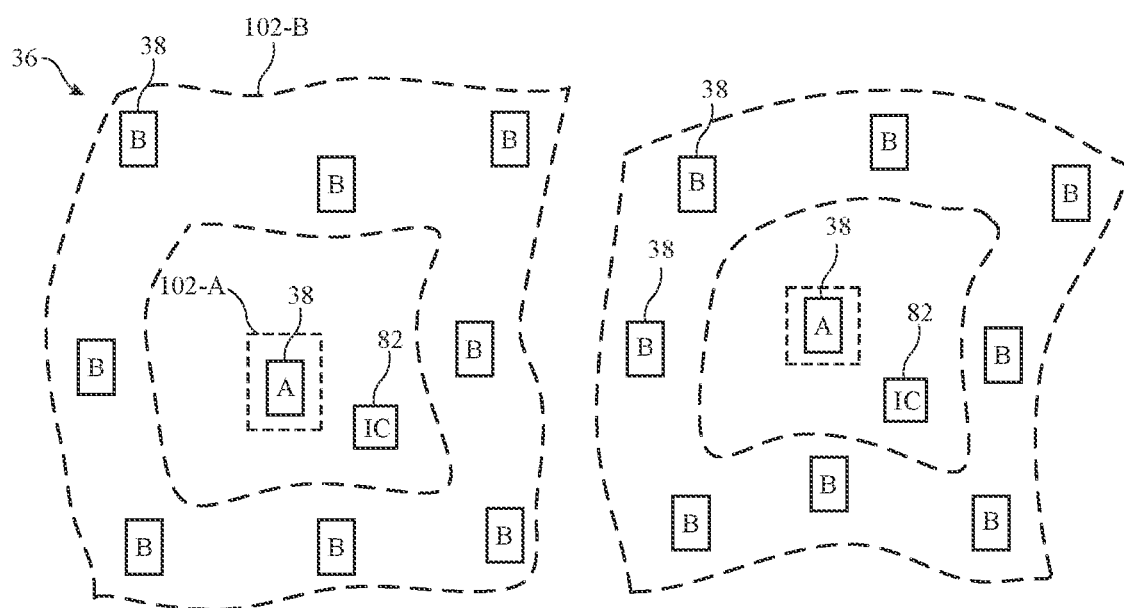
FIG. 26 is a top view of an illustrative LED array showing how a center LED may be driven at a higher current than surrounding, peripheral LEDs to achieve a desired emission profile in accordance with an embodiment.

To achieve a desired emission profile, the center LED of a given LED zone may be driven with more current than the peripheral LEDs. FIG. 26 is a top view of an illustrative LED array showing how a first LED in a first zone 102-A may be driven with a different current than the LEDs in a second zone 102-B. Having the center LED ('A') be driven with a higher current may optimize the emission profile of the 3×3 group of LEDs. A single driver IC 82 may be used to drive both zones 102-A and 102-B, or two discrete driver ICs may be used to drive the two zones. Although the LEDs in zones 102-A and 102-B are driven with different currents and may therefore be referred to as different zones, the 3×3 group of LEDs may still be designed to operate together to achieve a desired emission profile. Therefore, the 3×3 group may sill be referred to as a unitary LED group or LED cell.

In the LED group formed by LED zones 102-A and 102-B, the ratio of current between the peripheral LEDs ('B') and the central LED ('A') may be constant. In other words, the LED group still may have a single target brightness value, and the driver IC may apply currents per a predetermined ratio to achieve the target brightness and the optimized emission profile. The example in FIG. 26 of the central LED having a different current (brightness) than the peripheral LEDs is merely illustrative. In general, any of the LEDs within the group may have a unique brightness to help tune the emission profile as desired.

Herein, the LED array with driver ICs in the active area is described as serving as a backlight for a pixel array (e.g., a liquid crystal pixel array). It should be noted that, if desired, an arrangement of the type shown herein may be used to form a stand-alone display (e.g., without the external LCD pixels). The LEDs may form display pixels that are controlled by driver ICs in the active area.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
   a plurality of pixels; and
   a backlight configured to produce backlight illumination for the plurality of pixels, wherein the backlight comprises:
   a glass substrate having first and second opposing surfaces;
   an array of light-emitting diodes mounted on the first surface of the glass substrate, wherein the array of light-emitting diodes is overlapped by the plurality of pixels;
   driver integrated circuits mounted on the first surface of the glass substrate, wherein each driver integrated circuit controls at least one light-emitting diode of the array of light-emitting diodes; and
   a thermally conductive layer attached to the second surface of the glass substrate.

2. The electronic device defined in claim 1, wherein the backlight has an active area and wherein each driver integrated circuit is positioned within the active area.

3. The electronic device defined in claim 1, wherein the array of light-emitting diodes comprises a two-dimensional array of light-emitting diodes and wherein the driver integrated circuits are interspersed amongst the two-dimensional array of light-emitting diodes.

4. The electronic device defined in claim 1, further comprising:
   a controller configured to provide digital signals to the driver integrated circuits.

5. The electronic device defined in claim 4, wherein the controller is a timing controller configured to provide the digital signals directly to the driver integrated circuits.

6. The electronic device defined in claim 4, wherein the controller is a backlight controller and wherein the electronic device further comprises:
   a timing controller configured to provide control signals to the backlight controller, wherein the backlight controller is configured to provide the digital signals directly to the driver integrated circuits based on the control signals.

7. The electronic device defined in claim 1, wherein the thermally conductive layer has a thermal conductivity that is greater than 100 W/mK.

8. The electronic device defined in claim 7, wherein the thermally conductive layer is a reflective and thermally conductive layer having a reflectance that is greater than 80%.

9. The electronic device defined in claim 1, wherein the thermally conductive layer comprises graphite.

10. The electronic device defined in claim 1, wherein the backlight further comprises:
    a reflective layer that is interposed between the thermally conductive layer and the second surface of the glass substrate.

11. An electronic device comprising:
    a plurality of pixels; and
    a backlight configured to produce backlight illumination for the plurality of pixels, wherein the backlight comprises:
    a substrate;
    a two-dimensional array of light-emitting diodes mounted on the substrate, wherein the two-dimensional array of light-emitting diodes is arranged in a two-dimensional array of respective cells;
    driver integrated circuits mounted on the substrate, wherein each driver integrated circuit controls at least one cell;
    sensors mounted on the substrate, wherein the sensors are interspersed amongst the two-dimensional array of light-emitting diodes; and
    a controller configured to control the two-dimensional array of light-emitting diodes based at least partially upon information from the sensors.

12. The electronic device defined in claim 11, wherein the backlight has an active area and wherein each driver integrated circuit is positioned within the active area.

13. The electronic device defined in claim 11, wherein the driver integrated circuits are interspersed amongst the two-dimensional array of light-emitting diodes.

14. The electronic device defined in claim 11, wherein the sensors comprise temperature sensors configured to measure a temperature associated with at least a portion of the backlight.

15. The electronic device defined in claim 11, wherein the sensors comprise optical sensors configured to measure a light output from at least one light-emitting diode of the two-dimensional array of light-emitting diodes.

16. The electronic device defined in claim 11, wherein the sensors comprise temperature sensors and optical sensors.

17. An electronic device comprising:
    a plurality of pixels; and
    a backlight configured to produce backlight illumination for the plurality of pixels, wherein the backlight comprises:
    a glass thin-film circuitry layer including a conductive layer on a glass substrate;
    a two-dimensional array of light-emitting diodes mounted on an upper surface of the glass thin-film circuitry layer;
    driver integrated circuits mounted on the upper surface of the glass thin-film circuitry layer; and
    a heat sink structure that is coupled to an exposed portion of the conductive layer.

18. The electronic device defined in claim 17, wherein the conductive layer is a first conductive layer and wherein the glass thin-film circuitry layer comprises a second conductive layer and an insulating layer that is interposed between the first and second conductive layers.

19. The electronic device defined in claim 18, wherein an exposed portion of the second conductive layer is coupled to an additional heat sink structure.

20. The electronic device defined in claim 17, wherein the driver integrated circuits are interspersed amongst the two-dimensional array of light-emitting diodes.

* * * * *